US011322565B2

(12) United States Patent
Jeon et al.

(10) Patent No.: US 11,322,565 B2
(45) Date of Patent: May 3, 2022

(54) DISPLAY DEVICE

(71) Applicant: LG Display Co., Ltd., Seoul (KR)

(72) Inventors: YoungHo Jeon, Goyang-si (KR);
KyungChan Kim, Paju-si (KR);
Mingyu Kang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 245 days.

(21) Appl. No.: 16/720,689

(22) Filed: Dec. 19, 2019

(65) Prior Publication Data

US 2020/0212117 A1    Jul. 2, 2020

(30) Foreign Application Priority Data

Dec. 27, 2018   (KR) .................. 10-2018-0171062
Nov. 6, 2019   (KR) .................. 10-2019-0140778

(51) Int. Cl.
*H01L 27/32*     (2006.01)
*G09F 9/30*     (2006.01)
(Continued)

(52) U.S. Cl.
CPC .......... *H01L 27/326* (2013.01); *G09F 9/301* (2013.01); *H01L 27/3218* (2013.01);
(Continued)

(58) Field of Classification Search
CPC .................. H01L 2251/5338; G09F 9/301
See application file for complete search history.

(56) References Cited

U.S. PATENT DOCUMENTS 9,691,996 B2   6/2017   Lee
9,730,330 B1   8/2017   Boyle et al.
(Continued)

FOREIGN PATENT DOCUMENTS

CN      208189154 U    12/2018
JP      2017-111200 A    6/2017
(Continued)

OTHER PUBLICATIONS

Notice of Reasons for Refusal dated Oct. 9, 2020, issued in corresponding Japanese Patent Application No. 2019-226217 (with machine English translation).
(Continued)

*Primary Examiner* — Vip Patel
(74) *Attorney, Agent, or Firm* — Morgan, Lewis & Bockius LLP

(57) ABSTRACT

The present disclosure relates to a stretchable display device. According to an embodiment of the present disclosure, a stretchable display device includes a lower substrate having a plurality of first areas in which a plurality of sub-pixels is included, a plurality of second areas in which a plurality of connection lines is included, the connection lines electrically connecting adjacent ones of the first areas, and a plurality of third areas other than the first areas and the second areas. The stretchable display device further includes a plurality of additional sub-pixels in the respective third areas, and a plurality of piezoelectric patterns electrically connected to the respective additional sub-pixels. Adjacent ones of the first areas are spaced apart from one another. The stretchable display device may suppress deterioration of image quality when it is stretched.

19 Claims, 12 Drawing Sheets

(51) Int. Cl.
  *H01L 51/52* (2006.01)
  *H01L 51/56* (2006.01)
(52) U.S. Cl.
  CPC ...... *H01L 27/3276* (2013.01); *H01L 51/5237* (2013.01); *H01L 51/56* (2013.01); *H01L 2251/5338* (2013.01)

(56) References Cited

U.S. PATENT DOCUMENTS

| | | |
|---|---|---|
| 2002/0094701 A1 | 7/2002 | Biegelsen |
| 2010/0328328 A1 | 12/2010 | Choi et al. |
| 2017/0068318 A1 | 3/2017 | McClure et al. |
| 2018/0323385 A1 | 11/2018 | Liu et al. |

FOREIGN PATENT DOCUMENTS

| | | |
|---|---|---|
| KR | 10-2016-0101825 A | 8/2016 |
| WO | 2009/104840 A2 | 8/2009 |

OTHER PUBLICATIONS

Extended European Search Report dated Jun. 4, 2020 in corresponding European Patent Application No. 19216554.6.

DISPLAY DEVICE

CROSS-REFERENCE TO RELATED APPLICATIONS

This application claims priority to Korean Patent Application No. 10-2018-0171062 filed in the Korean Intellectual Property Office on Dec. 27, 2018 and Korean Patent Application No. 10-2019-0140778 filed in the Korean Intellectual Property Office on Nov. 6, 2019, the disclosures of which are incorporated herein by reference in their entirety as if fully set forth herein.

BACKGROUND

Technical Field

The present disclosure relates to a display device, and more particularly, to a stretchable display device that may have an improved aperture ratio and superior image quality, even when stretched.

Description of the Related Art

Display devices used in the monitor of a computer, a television (TV), a mobile phone, or the like may include an organic light-emitting display (OLED) that emits light by itself, or a liquid-crystal display (LCD) that requires a separate light source.

More and more applications are being found for such display devices, including computer monitors and televisions, as well as personal portable devices. Accordingly, research is ongoing to develop display devices having a larger display area with reduced volume and weight.

Recently, stretchable display devices are attracting attention as next generation display devices. These stretchable display devices may be fabricated by disposing display elements and lines on a flexible substrate made of a flexible material such as plastic, so that they can be expanded and contracted in a particular direction and can be changed into various shapes.

SUMMARY

A display device capable of displaying an image even if it is bent or stretched may be referred to as a stretchable display device. A stretchable display device may have higher flexibility than existing typical display devices. Accordingly, the shape of a stretchable display device may be changed as a user desires, such as by bending or stretching. For example, if a user grasps an end of a stretchable display device and pulls it, the stretchable display device may be stretched by the user's force. Alternatively, when a user places a stretchable display device on an uneven wall, the stretchable display device may be transformed according to the contours of the surface of the wall. In addition, when the force exerted by the user is removed, the stretchable display device may return to its original shape.

Such a stretchable display device may be implemented to have rigid regions and a flexible region. Display elements may be disposed in the rigid regions to emit light, and the flexible region may be stretched when an external force is applied to the stretchable display device.

As described above, when a stretchable display device is stretched, it may not be uniformly stretched over the entire region of the display device. Instead, only the flexible region may be substantially stretched. Therefore, the distance between the rigid regions may increase when the stretchable display device is stretched, and the distance between the light-emitting elements may also increase accordingly. As a result, the density of the light-emitting regions in the stretchable display device may be reduced, and image quality may deteriorate. Thus, the lattice pattern perceived by a user when the stretchable display device is stretched—that is, mura artifacts such as a stripe feature visually recognized by a user when the luminance drops in the regions between the light-emitting elements—becomes more serious. In addition, when the stretchable display device is stretched, the screen may sag along a stretched direction, and the ratio of the image displayed on the stretchable display device may be distorted.

In view of the above, the inventors of the present disclosure have recognized such particular issues of stretchable display devices and have devised a novel display device to improve the issues.

Accordingly, the present disclosure directed to a display device that substantially obviates one or more problems due to limitations and disadvantages of the related art.

An object of the present disclosure is to provide a display device that may suppress the deterioration of image quality when the display device is stretched, for example, by having a particular structure disposing a plurality of light-emitting elements on the lower substrate.

Another object of the present disclosure is to provide a display device that may reduce mura artifacts such as a lattice pattern when the display device is stretched, for example, by having a particular structure disposing a plurality of light-emitting elements on a flexible region between the light-emitting elements.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display apparatus comprises a display module including a display panel and configured to display an image; a rear cover on a rear surface of the display module; a first vibration generating module in a first rear region of the rear cover; and a second vibration generating module in a second rear region of the rear cover, wherein the rear cover includes: a first hole that overlaps the first vibration generating module, and a second hole that overlaps the second vibration generating module.

According to an aspect of the present disclosure, there is provided a stretchable display device including: a lower substrate comprising a plurality of first areas in which a plurality of sub-pixels is included, a plurality of second areas in which a plurality of connection lines is included, the connection lines electrically connecting adjacent ones of the first areas, and a plurality of third areas other than the first areas and the second areas; a plurality of additional sub-pixels disposed in the respective third areas; and a plurality of piezoelectric patterns electrically connected to the respective additional sub-pixels, wherein the adjacent ones of the first areas are spaced apart from one another. The stretchable display device may suppress deterioration of image quality when it is stretched.

According to another aspect of the present disclosure, there is provided a stretchable display device including: a plurality of rigid boards including a plurality of light-emitting elements disposed thereon and spaced apart from one another; a plurality of connection lines electrically connecting between pads disposed on adjacent ones of the rigid boards; a lower substrate under the rigid boards and the connection lines; a plurality of additional light-emitting elements on the lower substrate and spaced apart from the rigid boards and the connection lines; and a plurality of piezoelectric patterns electrically connected to the additional light-emitting elements and configured to generate a first voltage when the lower substrate is deformed, wherein the additional light-emitting elements emit light according to the first voltage from the piezoelectric patterns when the lower substrate is deformed, and thereby suppress a lattice pattern from being perceived by a viewer.

Other detailed matters of the example embodiments are included in the detailed description and the drawings.

According to an example embodiment of the present disclosure, by disposing additional sub-pixels in regions of the lower substrate, other than the regions where a plurality of island substrates and a plurality of connection lines are disposed, it may be possible to efficiently utilize the area of the stretchable display device and to increase the aperture ratio.

According to an example embodiment of the present disclosure, by connecting the additional sub-pixels to a different circuitry than that circuitry existing sub-pixels are connected to, thereby driving each sub-pixel independently, resolution may be increased.

According to an example embodiment of the present disclosure, by disposing additional pixels in the dummy regions of the lower substrate, it may be possible to efficiently utilize the given area to thereby increase the area of the light-emitting regions.

According to an example embodiment of the present disclosure, by way of disposing a plurality of additional light-emitting elements capable of emitting light between the light-emitting elements, it may be possible to compensate for a decrease in luminance as the distance between light-emitting elements is increased when the stretchable display device is stretched.

According to an example embodiment of the present disclosure, by disposing a plurality of additional sub-pixels on the flexible regions between a plurality of island substrates, it may be possible to reduce the distortion of the images and mura artifacts such as a lattice pattern when the stretchable display device is stretched.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
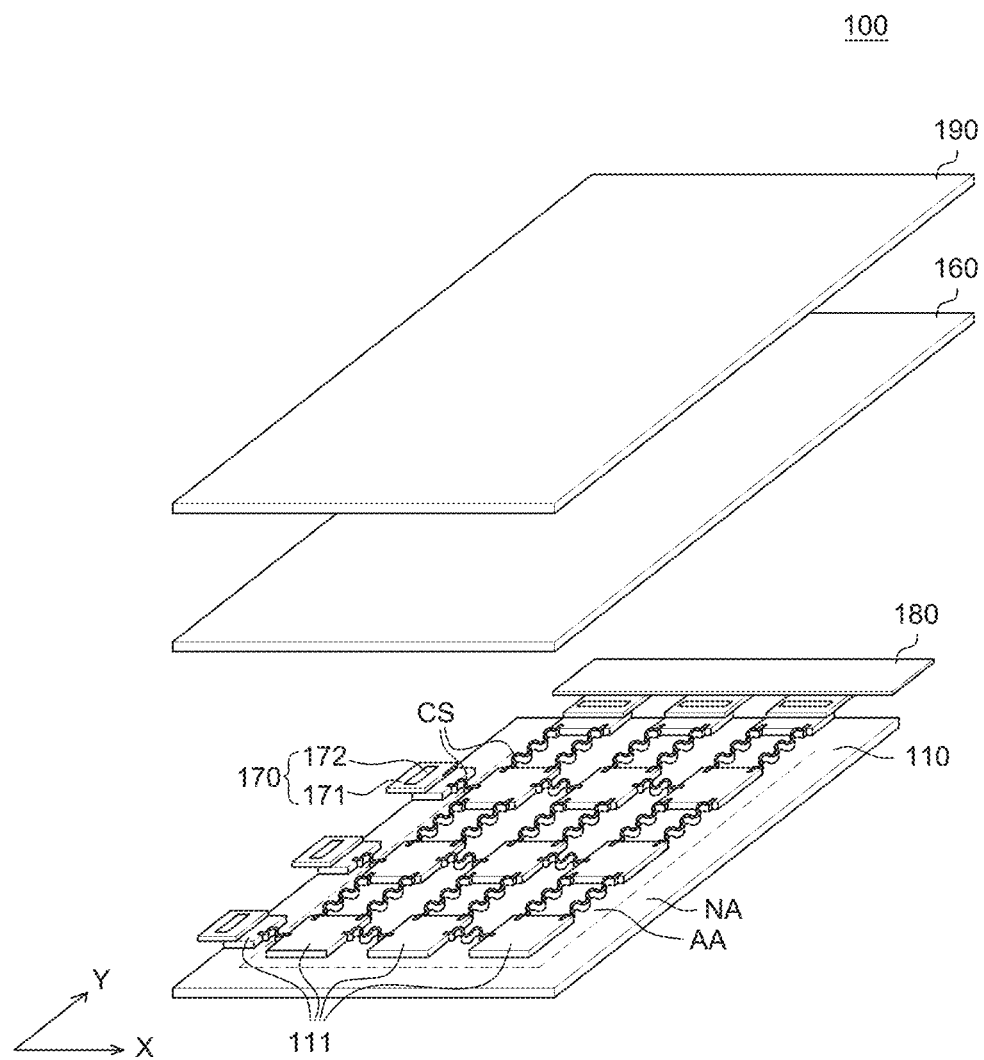
FIG. 1 is an exploded perspective view of a stretchable display device according to an example embodiment of the present disclosure.

Reference will now be made in detail to embodiments of the present disclosure, examples of which are illustrated in the accompanying drawings. Wherever possible, the same reference numbers may be used throughout the drawings to refer to the same or like parts.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings.

FIG. 1 is an exploded perspective view of a display device according to an example embodiment of the present disclosure. With reference to FIG. 1, a stretchable display device 100 includes a lower substrate 110, a plurality of island substrates 111, a plurality of connection substrates CS, a chip-on-film (COF) 170, a printed circuit board 180, an upper substrate 160, and a polarizing layer 190. In FIG. 1, a plurality of additional connection substrates CSA is not shown for convenience of illustration.

The lower substrate 110 supports and protects a variety of elements of the stretchable display device 100. The lower substrate 110 may be made of an insulating material that can be bent or stretched as a flexible substrate. For example, the lower substrate 110 may be made of an elastomer including a silicone rubber such as polydimethylsiloxane (PDMS) and a polyurethane (PU), and accordingly can have flexibility. It is, however, to be understood that the material of the lower substrate 110 is not limited thereto.

The lower substrate 110 may be a flexible substrate and may be reversibly expanded and contracted. In addition, the elastic modulus may be several MPa to several hundred MPa, and the elongation at break may be 100% or higher. The thickness of the lower substrate 110 may be, but is not limited to, 10 μm to 1 mm.

The lower substrate 110 includes a display area AA and a non-display area NA surrounding the display area AA. The display area AA is an area where an image is displayed in the stretchable display device 100, and a plurality of light-emitting elements 140 and a variety of driving elements for driving the plurality of light-emitting elements 140 are disposed therein.

The non-display area AA is adjacent to and surrounds the display area AA. In the non-display area NA, no image is displayed, and lines, circuit parts, etc. may be formed. For example, a plurality of pads may be disposed in the non-display area NA. Each of the pads may be connected to light-emitting elements 140 in the display area AA or to driving elements for driving the light-emitting elements 140.

A plurality of island substrates 111 is disposed on the lower substrate 110. The island substrates 111 may be rigid boards, and are spaced apart from one another on the lower substrate 110. The island substrates 111 may be more rigid than the lower substrate 110. In other words, the lower substrate 110 may be more flexible than the island substrates 111.

The island substrates 111, which are rigid boards, may be made of a plastic material having flexibility, and may be made of, for example, polyimide (PI), polyacrylate, polyacetate, etc.

The modulus of the island substrates 111 may be higher than the modulus of the lower substrate 110. As used herein, the modulus may refer to a modulus of elasticity, which indicates a quantity that measures a substrate's resistance to being deformed elastically when a stress is applied to it. The higher the modulus, the higher the hardness. Accordingly, the island substrates 111 may be rigid boards having rigidity as compared with the lower substrate 110. The modulus of the island substrates 111 may be, but is not limited to, 1,000 times larger than the modulus of the lower substrate 110.

The island substrates 111 having rigidity may be arranged on the lower substrate 110, and portions of the lower substrate 110 overlapping the island substrates 111 may be defined as rigid regions due to the island substrates 111. The other portions of the lower substrate 110 that do not overlap with the island substrates 111 may be defined as a flexible region because there is only the lower substrate 110. That is to say, the portions of the lower substrate 110 where the island substrates 111 are arranged may be defined as rigid regions, while the other portions of the lower substrate 110 where the island substrates 111 are not arranged may be defined as a flexible region. Because the island substrates 111 are spaced apart from one another, the rigid regions may also be spaced apart from one another. The flexible region may surround the rigid regions.

In some example embodiments, the portions of the lower substrate 110 in the rigid regions may have a higher modulus than the portions in the flexible region. That is to say, the portions of the lower substrate 110 overlapping the island substrates 111 may be made of a material having a modulus similar to that of the island substrates 111, whereas the portions not overlapping the island substrates 111 may be made of a modulus lower than that of the island substrates 111.

A plurality of connection substrates CS is disposed between the island substrates 111. The connection substrates CS connect adjacent ones of the island substrates 111 with one another. The connection substrates CS may be formed integrally with the island substrates 111, but the present disclosure is not limited thereto.

The connection substrates CS have a curved shape. For example, as shown in FIG. 1, the connection substrates CS may have a sine wave shape. However, it is to be understood that the shape of the connection substrates CS is not limited thereto. For example, the connection substrates CS may be extended in a zigzag shape, or may have the shape of diamond borders having their vertices connected to one another. The number and shape of the connection substrates CS shown in FIG. 1 are illustrative, and the number and shape of the connection substrates CS may be variously altered and is not limited herein.

The chip-on-film (COF) 170 is a film in which a variety of elements are disposed on a base film 171 having flexibility. The COF 170 provides signals to a plurality of light-emitting elements 140 in the display area AA and a variety of driving elements for driving the light-emitting elements 140. The COF 170 may be bonded to a plurality of pads arranged in the non-display area NA, and may provide the light-emitting elements 140 in the display area AA and a variety of driving elements for driving the light-emitting elements 140 with the supply voltage, data voltage, gate voltage, etc. through the pads. The COF 170 may include the base film 171 and a driver integrated circuit (IC) 172, and a variety of other elements may be disposed thereon.

The base film 171 is a layer for supporting the driver IC 172 of the COF 170. The base film 171 may be made of an insulating material, for example, an insulating material having flexibility.

The driver IC 172 is an element for processing data for displaying image and driving signals for processing the data. Although the driver IC 172 is mounted in the form of a COF in FIG. 1, it is to be understood that the driver IC 172 may also be mounted in the form of a chip-on-glass (COG), a tape-carrier-package (TCP), etc.

A control unit such as an IC chip and circuitry may be mounted on the printed circuit board 180. A memory, a processor, etc. may also be mounted on the printed circuit board 180. The printed circuit board 180 transmits signals for driving the light-emitting elements 140 from the control unit to the display area AA. The printed circuit board 180 may be connected to the COF 170 to thereby be electrically connected to the light-emitting elements 140 in the display area AA and the driving elements for driving the light-emitting elements 140.

The upper substrate 160 overlaps with the lower substrate 110 and protects a variety of elements of the stretchable display device 100. The upper substrate 160 may be made of an insulating material that may be bent or stretched as a flexible substrate. For example, the upper substrate 160 may be made of a flexible material, and may be made of the same material as the lower substrate 110, but the present disclosure is not limited thereto.

The polarizing layer 190 is an element for suppressing reflection of external light in the stretchable display device 100, and may be disposed on the upper substrate 160 to overlap with it. It is, however, to be understood that the present disclosure is not limited thereto. The polarizing layer 190 may be disposed under the upper substrate 160 or may be eliminated depending on the structure of the stretchable display device 100.

Hereinafter, the stretchable display device 100 according to an example embodiment of the present disclosure will be described in more detail with reference to FIGS. 2 and 3.

Figure 2:
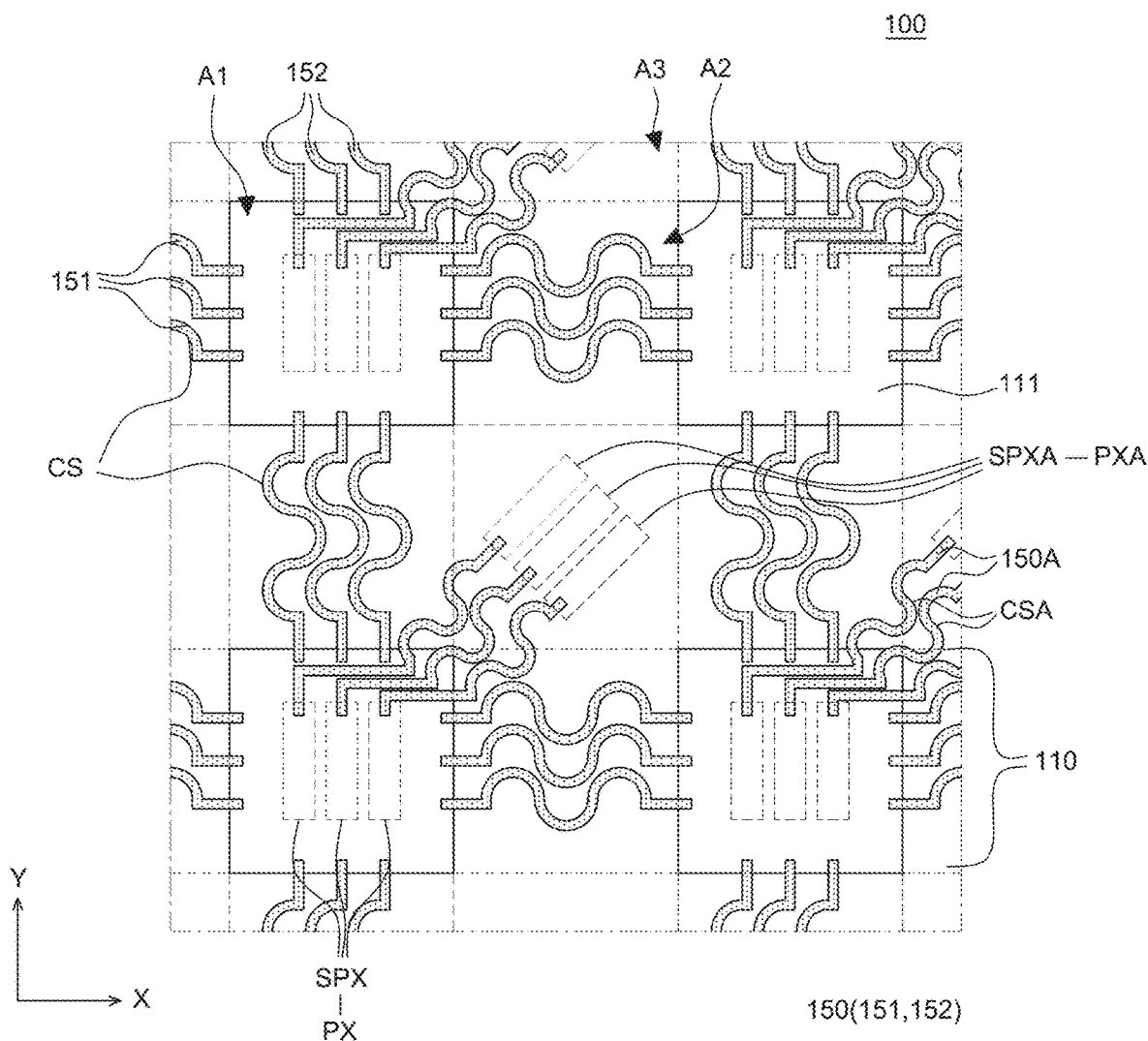
FIG. 2 is an enlarged plan view of a stretchable display device according to an example embodiment of the present disclosure.

FIG. 2 is an enlarged plan view of a stretchable display device according to an example embodiment of the present disclosure. FIG. 3 is a schematic cross-sectional view of a sub-pixel and an additional sub-pixel of a stretchable display device according to an example embodiment of the present disclosure.

Figure 3:
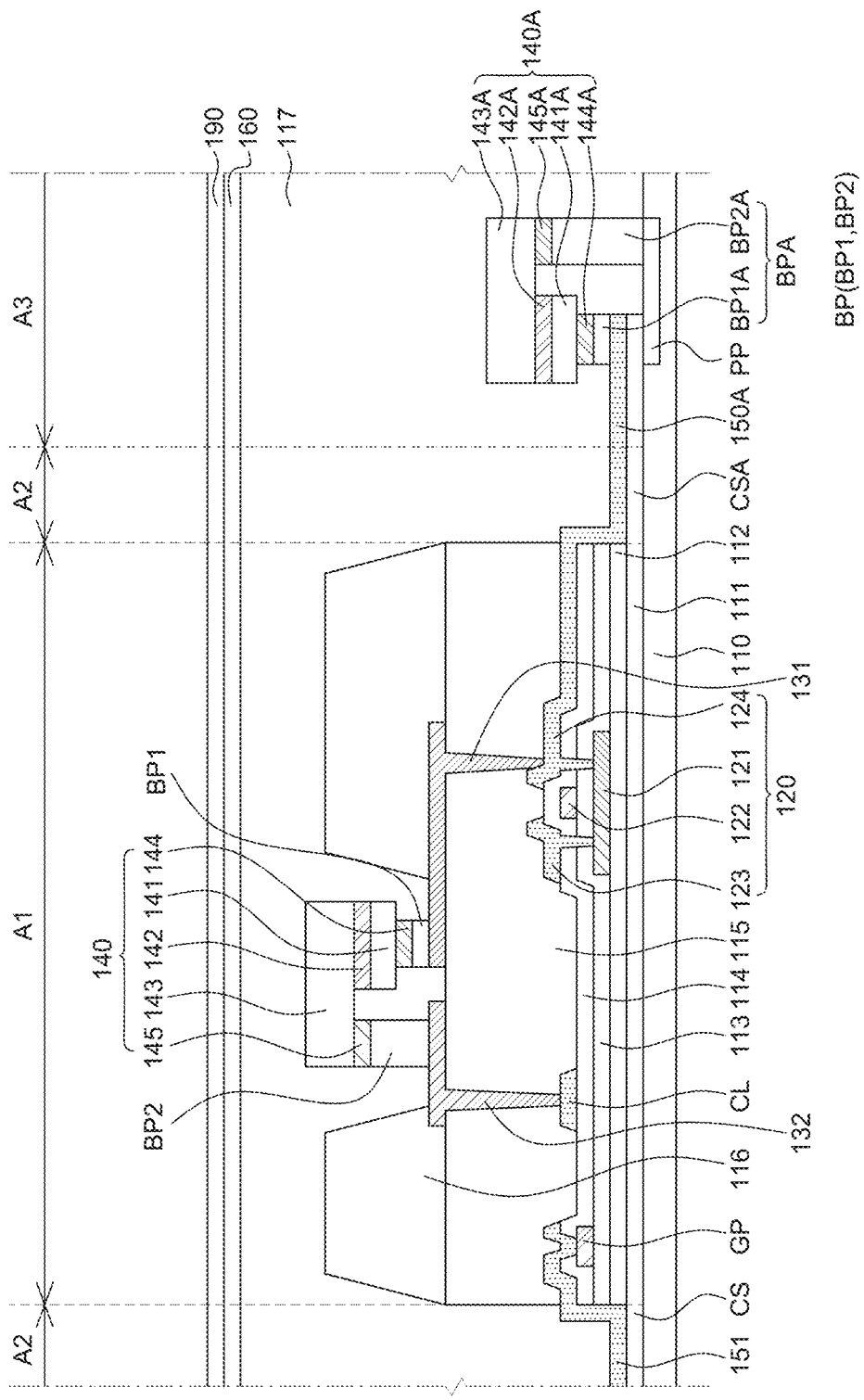
FIG. 3 is a schematic cross-sectional view of a sub-pixel and an additional sub-pixel of a stretchable display device according to an example embodiment of the present disclosure.

With reference to FIGS. 2 and 3, the lower substrate 110 has a plurality of first areas A1 in which a plurality of island substrates 111 is disposed, a plurality of second areas A2 in which a plurality of connection lines 150 is disposed, and a plurality of third areas A3 in which a plurality of additional sub-pixels SPXA is defined, other than the plurality of first areas A1 and the plurality of second areas A2.

In the first areas A1 of the lower substrate 110, the island substrates 111 are respectively disposed. The first areas A1 may have rigidity. The first areas A1 are defined on the lower substrate 110 such that they are spaced apart from one another. For example, the first areas A1 may be arranged in a matrix on the lower substrate 110, as shown in FIG. 2. It is, however, to be understood that the present disclosure is not limited thereto.

With reference to FIG. 2, a plurality of pixels PX each including a plurality of sub-pixels SPX is defined on the island substrates 111 of the first areas A1. In each of the sub-pixels SPX, the light-emitting element 140 and a variety of driving elements for driving the light-emitting element 140 may be disposed. Each of the sub-pixels SPX may be connected to a variety of lines. For example, each of the sub-pixels SPX may be connected to a variety of lines such as a gate line, a data line, a high-voltage supply line, a low-voltage supply line, a reference voltage line, and a common line CL.

On the lower substrate 110, the second areas A2 are defined such that they are adjacent to the first areas A1. Each of the second areas A2 is defined between two adjacent ones of the first areas A1. Accordingly, as shown in FIG. 2, second areas A2 are defined on the upper side, the lower side, the left side, and the right side of each of the first areas A1. In the second areas A2, a plurality of connection lines 150 and a plurality of connection substrates CS are disposed. The second areas A2 have flexibility. The second areas A2 are defined on the lower substrate 110 such that they are spaced apart from one another. For example, the second areas A2 may be arranged in a matrix on the lower substrate 110, as shown in FIG. 2. It is, however, to be understood that the present disclosure is not limited thereto.

In the second areas A2 of the lower substrate 110, the connection lines 150 and the connection substrates CS are disposed. The connection lines 150 are disposed on the connection substrates CS and electrically connect the pads on the island substrates 111 with one another. For example, the connection lines 150 may electrically connect the pads disposed on adjacent ones of the island substrates 111. The connection lines 150 are disposed on the second areas A2 between the first areas A1 to electrically connect the island substrates 111 with one another.

For a typical display device, a variety of lines such as gate lines and data lines are extended between the sub-pixels SPX. A plurality of sub-pixels SPX is connected to a single signal line. Accordingly, in a typical display device, the lines such as the gate lines, the data lines, the high-voltage supply line and the reference voltage line are seamlessly extended from one side to the other side of the display device on the substrate.

In contrast, for the stretchable display device 100 according to the example embodiment of the present disclosure, a variety of lines made of a metal, such as the gate line, the data line, the high-voltage supply line, the low-voltage supply line, the reference voltage line and the common line CL are disposed only on the island substrates 111. That is to say, in the stretchable display device 100 according to the example embodiment of the present disclosure, a variety of lines made of a metal are disposed only on the island substrates 111 but are not in contact with the lower substrate 110. Accordingly, the variety of lines made of a metal may be patterned such that they are disposed only on the island substrates 111 and extend discontinuously.

In the stretchable display device 100 according to the example embodiment of the present disclosure, the connection lines 150 may be disposed between every two adjacent ones of the islands substrates 111 in order to connect the discontinuous lines on the island substrates 111 with one another. For example, the connection lines 150 are connected to the pads on the two adjacent island substrates 111. A variety of lines such as the gate lines, the data lines, the high-voltage supply lines, the low-voltage supply lines, the reference voltage line and the common line CL on two adjacent island substrates 111 may be electrically connected to one another by the connection lines 150.

For example, a gate line may be disposed on the island substrates 111 disposed adjacent to each other in the x-axis direction, and gate pads GP may be disposed at both ends of the gate line. The gate pads GP on the island substrates 111 disposed adjacent to each other in the x-axis direction may be connected to each other by the connection lines 150 serving the gate lines. Accordingly, a gate line disposed on an island substrate 111 in the first area A1 and a connection line 150 disposed in the second area A2 may serve as a single gate line. In addition, each of the lines that may be included in the stretchable display device 100 such as the data lines, the high-voltage supply line, the low-voltage supply line, the reference voltage line and the common lines CL may also serve as a single line by each of the connection lines 150.

The connection lines 150 are disposed on connection substrates CS. As described above with reference to FIG. 1, the connection substrates CS have a curved shape. Accordingly, the connection lines 150 disposed on the connection substrates CS may have a curved shape, like the connection substrates CS.

The connection lines 150 may be made of a conductive material. The connection lines 150 may be made of the same material as the various conductive elements disposed on the island substrates 111. For example, the connection lines 150 may be made of, but are not limited to, a metal material. In addition, the connection lines 150 may include a base polymer and conductive particles dispersed in the base polymer.

With reference to FIG. 2, the connection lines 150 includes first connection lines 151 and second connection lines 152.

The first connection lines 151 are extended in the x-axis direction. Each of the first connection lines 151 may connect the pads on two island substrates 111 adjacent to each other in the x-axis direction. The first connection lines 151 may serve as, but are not limited to being, the gate lines or the low-voltage supply line, or the like. For example, when the first connection lines 151 serve as gate lines, they may electrically connect the gate pads GP on the two island substrates 111 arranged side by side with each other in the x-axis direction.

The second connection lines 152 are extended in the y-axis direction. The second connection lines 152 may connect the pads on two island substrates 111 adjacent to each other in the y-axis direction. The second connection lines 152 may serve as, but are not limited to being, the data lines or the high-voltage supply line, or the like. For example, when the second connection lines 152 serve as data lines, they may electrically connect the data pads on the two island substrates 111 arranged side by side with each other in the y-axis direction.

With reference to FIG. 2, the third areas A3 are defined on portions of the lower substrate 110 surrounded by the first areas A1 and the second areas A2. The second areas A2 may be disposed on the upper side, the lower side, the right side and the left side of each of the third areas A3, and the first areas A1 may be disposed adjacent to each of the third areas A3 in the four diagonal directions.

In each of the third areas A3 of the lower substrate 110, an additional pixel PXA including a plurality of additional sub-pixels SPXA is defined. In the additional sub-pixels SPXA, additional light-emitting elements 140A may be respectively disposed. The additional sub-pixels SPXA may be respectively connected to additional connection lines 150A.

The additional connection substrates CSA extended from the island substrates 111 to the additional sub-pixels SPXA are disposed. The additional connection substrates CSA may be extended from the first areas A1 to the third areas A3. The additional connection substrates CSA connect the island substrates 111 with the additional sub-pixels SPXA. The additional connection substrates CSA may be formed integrally with the island substrates 111, but the present disclosure is not limited thereto.

With reference to FIG. 3, the additional connection substrates CSA are disposed on the same plane as the connection substrates CS. Accordingly, the additional connection lines 150A on the additional connection substrates CSA and the connection lines 150 on the connection substrates CS may also be disposed on the same plane. The additional connection substrates CSA and the connection substrates CS may not overlap with each other but may be spaced apart from each other. If the additional connection substrates CSA are in contact with the connection substrates CS, the additional connection lines 150A on the additional connection substrates CSA may also be in contact with the connection lines 150 on the connection substrates CS, which may deteriorate the reliability of the stretchable display device 100. For this reason, the additional connection substrates CSA may be spaced apart from the connection substrates CS on the same plane.

The additional connection substrates CSA have a curved shape. For example, the additional connection substrates CSA may have a sine wave shape, like the connection substrates CS. However, it is to be understood that the shape of the additional connection substrates CSA is not limited thereto. For example, the additional connection substrates CSA may be extended in a zigzag shape, or may have the shape of diamond borders having their vertices connected to one another, for example.

The additional connection lines 150A are disposed on the additional connection substrates CSA. The additional connection lines 150A may electrically connect the additional sub-pixels SPXA with the respective sub-pixels SPX. For example, the additional connection lines 150A may electrically connect the driving elements of the sub-pixels SPX with the additional light-emitting elements 140A of the additional sub-pixels SPXA. The additional connection lines 150A may transfer voltages at the sub-pixels SPX to the respective additional sub-pixels SPXA.

The additional sub-pixels SPXA are orientated obliquely with respect to the directions in which the connection lines 150 are extended. The additional connection substrates CSA and the additional connection lines 150A extended from the island substrates 111 to the additional sub-pixels SPXA may also be orientated obliquely with respect to the directions in which the connection lines 150 are extended.

The third areas A3, which are the flexible region, may be stretched when the stretchable display device 100 is stretched. Accordingly, when the stretchable display device 100 is stretched, an external force may be applied to the additional connection lines 150A and the additional connection substrates CSA disposed in the third areas A3. For example, when the stretchable display device 100 is stretched in the x-axis direction in which the first connection lines 151 are extended, an external force may be applied to the additional connection lines 150A and the additional connection lines CSA such that they are extended in the x-axis direction. However, because the additional connection lines 150A and the additional connection substrates CSA are orientated obliquely with respect to the x-axis direction, the external force applied to the additional connection lines 150A and the additional connection substrates CSA may be dispersed. In addition, when the stretchable display device 100 is stretched in the y-axis direction in which the second connection lines 152 are extended, an external force may be applied to the additional connection lines 150A and the additional connection lines CSA such that they are extended in the y-axis direction. However, because the additional connection lines 150A and the additional connection substrates CSA are orientated obliquely with respect to the y-axis direction, the external force applied to the additional connection lines 150A and the additional connection substrates CSA may be dispersed. That is to say, by disposing the additional connection lines 150A and the additional connection substrates CSA such that they are orientated obliquely with respect to the x-axis direction and the y-axis direction, it may be possible to reduce the external force applied to the additional connection lines 150A and the additional connection substrates CSA when the stretchable display device 100 is stretched. In addition, it may be possible to reduce damage to the additional connection lines 150A and the additional connection substrates CSA.

Hereinafter, the sub-pixels SPX and the additional sub-pixels SPXA will be described in more detail with reference to FIG. 3.

With reference to FIG. 3, a buffer layer 112 is disposed on the island substrates 111. The buffer layer 112 is disposed on the island substrates 111 for protecting a variety of elements of the stretchable display device 100 from moisture and oxygen introduced from the outside of the lower substrate 110 and the island substrates 111. The buffer layer 112 may be made of an insulating material. The buffer layer 112 may be made up of a single layer or multiple layers of an inorganic layer made of, for example, silicon nitride (SiNx), silicon oxide (SiOx), silicon oxynitride (SiON), etc. In some implementations, however, the buffer layer 112 may be eliminated, depending on the structure or characteristics of the stretchable display device 100.

The buffer layer 112 may be disposed only on the island substrates 111. As described above, because the buffer layer 112 may be made of an inorganic material, it may be damaged. For example, cracks may easily occur when the stretchable display device 100 is stretched.

The buffer layer 112 is not disposed between the island substrates 111, but may be patterned in the shape of the island substrates 111 and disposed only on the island substrates 111. Accordingly, in the stretchable display device 100 according to the example embodiment of the present disclosure, by disposing the buffer layer 112 only on the island substrates 111, which are rigid boards, it may be possible to prevent damage to the buffer layer 112 when the stretchable display device 100 is deformed by being bent or stretched.

A first transistor 120 including a first gate electrode 122, a first active layer 121, a first source electrode 123 and a first drain electrode 124 is disposed on the buffer layer 112.

The first active layer 121 is disposed on the buffer layer 112. In an example, the first active layer 121 may be formed of an oxide semiconductor or may be formed of an amorphous silicon (a-Si), a polycrystalline silicon (poly-Si), an organic semiconductor, or the like.

A gate insulating layer 113 is disposed on the first active layer 121. The gate insulating layer 113 electrically isolates the first gate electrode 122 from the first active layer 121 and may be made of an insulating material. For example, the gate insulating layer 113 may be made up of a single layer of silicon nitride (SiNx) or silicon oxide (SiOx) which is an inorganic material, or multiple layers of silicon nitride (SiNx) and silicon oxide (SiOx). It is, however, to be understood that the present disclosure is not limited thereto.

The first gate electrode 122 is disposed on the gate insulating layer 113. The first gate electrode 122 overlaps with the first active layer 121. The first gate electrode 122 may be formed of, but is not limited to, one of a variety of metal materials including molybdenum (Mo), aluminum (Al), chromium (Cr), gold (Au), titanium (Ti), nickel (Ni), neodymium (Nd) and copper (Cu), an alloy of two or more thereof, or multiple layers thereof.

An interlayer dielectric layer 114 is disposed on the first gate electrode 122. The interlayer dielectric layer 114 insulates the first gate electrode 122 from the first source electrode 123 and the first drain electrode 124, and may be made of an inorganic material, like the buffer layer 112. For example, the interlayer dielectric layer 114 may be made up of a single layer of silicon nitride (SiNx) or silicon oxide (SiOx), which are inorganic materials, or multiple layers of silicon nitride (SiNx) and silicon oxide (SiOx). It is, however, to be understood that the present disclosure is not limited thereto.

The first source electrode 123 and the first drain electrode 124, which are in contact with the first active layer 121, are disposed on the interlayer dielectric layer 114. The first source electrode 123 is spaced apart from the first drain electrode 124 on the same layer. The first source electrode 123 and the first drain electrode 124 may be electrically connected to the first active layer 121 by being in contact with the first active layer 121. The first source electrode 123 and the first drain electrode 124 may be formed of, but is not limited to, one of a variety of metal materials including molybdenum (Mo), aluminum (Al), chromium (Cr), gold (Au), titanium (Ti), nickel (Ni), neodymium (Nd) and copper (Cu), an alloy of two or more thereof, or multiple layers thereof.

The gate insulating layer 113 and the interlayer dielectric layer 114 may be patterned so that they are disposed only on the island substrates 111. The gate insulating layer 113 and the interlayer dielectric layer 114 may also be made of an inorganic material, like the buffer layer 112. Thus, the gate insulating layer 113 and the interlayer dielectric layer 114 may be damaged—for example, cracks may occur easily when the stretchable display device 100 is stretched. Accordingly, the gate insulating layer 113 and the interlayer dielectric layer 114 are not disposed between the island substrates 111, but may be patterned in the shape of the island substrates 111 and disposed only on the island substrates 111.

Although only the first transistor 120, which is a driving transistor among various transistors included in the stretchable display device 100, is shown in FIG. 3 for convenience of illustration, it is to be understood that a switching transistor, a capacitor, etc. may be included in the display device. In addition, although the first transistor 120 has a coplanar structure herein, other thin-film transistors having, e.g., a staggered structure, may also be employed.

With reference to FIG. 3, a gate pad GP is disposed on the gate insulating layer 113. The gate pad GP is a pad for transmitting gate signals to the sub-pixels SPX. The gate pad GP may be made of the same material as the first gate electrode 122, but the present disclosure is not limited thereto.

The gate pad GP may transfer a gate signal from the connection line 150 serving as a gate line to the sub pixels SPX. The gate pad GP is connected to the connection line 150 and transfers the gate signal to the sub-pixels SPX.

The connection line 150 is in contact with the side surfaces of the buffer layer 112, the gate insulating layer 113 and the interlayer dielectric layer 114, and is extended from the upper surface of the connection substrate CS to the upper surface of the interlayer dielectric layer 114. The connection line 150 may be in contact with the gate pad GP through a contact hole of the interlayer dielectric layer 114. Thus, the connection line 150 is electrically connected to the gate pad GP and may transfer the gate signal to the gate pad GP.

The common line CL is disposed on the interlayer dielectric layer 114. The common line CL may apply a common voltage to the sub-pixels SPX. The common line CL may be made of, but is not limited to, the same material as the first source electrode 123 and the first drain electrode 124 of the first transistor 120.

A planarization layer 115 is disposed over the first transistor 120, the common line CL and the interlayer dielectric layer 114. The planarization layer 115 may provide a flat surface over the island substrates 111 each including the first transistor 120, or may provide a flat surface under the light-emitting element 140. The planarization layer 115 may be a single layer or multiple layers and may be made of organic material. For example, the planarization layer 115 may be made of, but is not limited to, an acryl based organic material. The planarization layer 115 may include a contact hole for electrically connecting the first transistor 120 with the light-emitting element 140, a contact hole for electrically connecting the gate pad GP with a connection pad, and a contact hole for electrically connecting the common line CL with the light-emitting element 140.

In some example embodiments, a passivation layer may be formed between the first transistor 120 and the planarization layer 115. That is to say, the passivation layer covering the first transistor 120 may be formed to protect the first transistor 120 from the permeation of moisture, oxygen, etc. The passivation layer may be made of an inorganic material and may be made up of a single layer or multiple layers, but the present disclosure is not limited thereto.

A first pad 131 and a second pad 132 are disposed on the planarization layer 115. The first pad 131 is an electrode electrically connecting the first transistor 120 with the light-emitting element 140. The first pad 131 may be disposed on the planarization layer 115 and may be in contact with the light-emitting element 140. The first pad 131 may be in contact with the first drain electrode 124 of the first transistor 120 through a contact hole formed in the planarization layer 115. Therefore, the light-emitting element 140 may be electrically connected to the first drain electrode 124 of the first transistor 120 by the first pad 131. The first pad 131 may instead be connected to the first source electrode 123 of the first transistor 120 depending on the type of the first transistor 120, but the present disclosure is not limited thereto.

The second pad 132 is an electrode electrically connecting the light-emitting element 140 with the common line CL. The second pad 132 may be disposed on the planarization layer 115 to be in contact with the light-emitting element 140. The second pad 132 may be in contact with the common line CL through the contact hole formed in the planarization layer 115. Accordingly, the light-emitting element 140 may be electrically connected to the common line CL by the second pad 132.

A bank 116 is disposed on the first pad 131, the second pad 132 and the planarization layer 115. The bank 116 may include a black material in order to prevent light emitted from the light-emitting element 140 from being transmitted to an adjacent sub-pixel SPX such that the light is mixed. The bank 116 may be made of an organic insulating material, and may be made of the same material as the planarization layer 115. For example, the bank 116 may be made of, but is not limited to, an acryl based resin, a benzocyclobutene (BCB) based resin, or a polyimide.

The light-emitting element 140 is disposed on the first pad 131, the second pad 132 and the planarization layer 115. The light-emitting element 140 is disposed in each of the sub-pixels SPX and emits light in a particular wavelength range. For example, the light-emitting element 140 may be, but is not limited to, a blue light-emitting element 140 that emits blue light, a red light-emitting element 140 that emits red light, or a green light-emitting element 140 that emits green light.

The light-emitting element 140 may be defined differently depending on the type of the stretchable display device 100. When the stretchable display device 100 is an organic light-emitting stretchable display device, the light-emitting element 140 may be an organic light-emitting element 140 including an anode, an organic emissive layer 142, and a cathode. When the stretchable display device 100 is an inorganic light-emitting stretchable display device, the light-emitting element 140 may be a light-emitting diode (LED) including an n-type semiconductor layer, an emissive layer, and a p-type semiconductor layer, which in an example, form a micro light-emitting diode (micro LED). In the following description, a micro LED is employed as an example of the light-emitting element 140, which is the inorganic light emitting device 140. It is, however, to be understood that an organic light-emitting element may also be used as the light-emitting element 140.

The light-emitting element 140 includes a first semiconductor layer 141, an emissive layer 142, a second semiconductor layer 143, a first electrode 144, and a second electrode 145. In the following description, a micro LED having a flip chip structure is employed as the light-emitting element 140 for convenience of illustration. It is, however, to be understood that a micro LED having a lateral or vertical structure may be employed as the light-emitting element 140, for example.

The first electrode 144 is disposed on the first pad 131, and the second electrode 145 is disposed on the second pad 132. The first electrode 144 and the second electrode 145 are electrically connected to the first pad 131 and the second pad 132, respectively. The first electrode 144 may transfer the voltage from the drain electrode of the first transistor 120 to the first semiconductor layer 141, and the second electrode 145 may transfer the voltage from the common line CL to the second semiconductor layer 141.

A plurality of bonding patterns BP is disposed between the first pad 131 and the light-emitting element 140 and between the second pad 132 and the light-emitting element 140. The plurality of bonding patterns BP are media for bonding a plurality of light-emitting elements 140 onto the first pad 131 and the second pad 132. For example, the plurality of bonding patterns BP may be, but is not limited to, gold (Au) bumps or solder bumps.

The bonding patterns BP include a first bonding pattern BP1 and a second bonding pattern BP2. The first bonding pattern BP1 is disposed between the first pad 131 and the first electrode 144, and the second bonding pattern BP2 is disposed between the second pad 132 and the second electrode 145. The light-emitting elements 140 may be bonded onto the island substrates 111, respectively, by the bonding patterns BP disposed between the first electrode 144 and the first pad 131 and between the second electrode 145 and the second pad 132. In addition, the second bonding pattern BP2 disposed between the second electrode 145 and the second pad 132 may compensate for the step difference between the second electrode 145 of the light-emitting element 140 and the second pad 132.

The first semiconductor layer 141 is disposed on the first electrode 144, and the second semiconductor layer 143 is disposed on the first semiconductor layer 141. The first semiconductor layer 141 and the second semiconductor layer 143 may be formed by implanting n-type or p-type impurities into gallium nitride (GaN). For example, the first semiconductor layer 141 may be a p-type semiconductor layer formed by implanting p-type impurities into gallium nitride, and the second semiconductor layer 143 may be an n-type semiconductor layer formed by implanting n-type impurities into gallium nitride. The p-type impurities may be, but are not limited to, magnesium (Mg), zinc (Zn), beryllium (Be), etc. The n-type impurities may be, but are not limited to, silicon (Si), germanium (Ge), tin (Sn), etc.

The emissive layer 142 is disposed between the first semiconductor layer 141 and the second semiconductor layer 143. The emissive layer 142 may receive holes and electrons from the first semiconductor layer 141 and the second semiconductor layer 143 to emit light. The emissive layer 142 may be made up of a single layer or a multi-quantum well (MQW) structure. For example, the emissive layer 142 may be made of, but is not limited to, indium gallium nitride (InGaN) or gallium nitride (GaN).

A part of the second semiconductor layer 143 protrudes outwardly from the emissive layer 142 and the first semiconductor layer 141. In other words, the emissive layer 142 and the first semiconductor layer 141 may be smaller than the second semiconductor layer 143 such that the lower surface of the second semiconductor layer 143 is exposed. The second semiconductor layer 143 may be exposed from the emissive layer 142 and the first semiconductor layer 141 in order to be electrically connected to the second pad 132.

With reference to FIG. 3, the additional connection substrate CSA and the additional connection line 150A extended from the first area A1 to the third area A3 of the lower substrate 110 are disposed on the lower substrate 110. The additional connection line 150A may be an extended part of the first drain electrode 124 of the first transistor 120 of the island substrate 111. The additional connection line 150A may be extended from the first drain electrode 124 in the first area A1 of the lower substrate 110 to the third area A3. Accordingly, the additional connection line 150A may be electrically connected to the first drain electrode 124 of the first transistor 120 of the lower substrate 110 and may transfer the voltage from the first drain electrode 124 to the additional light-emitting elements 140A connected to the additional connection line 150. It is, however, to be understood that the present disclosure is not limited thereto. The additional connection line 150A may be disposed on a different layer from the first drain electrode 124 of the first transistor 120 and may be made of a different material. For example, the additional connection line 150A may be disposed on the same layer and may be made of the same material as the first pad 131, the first gate electrode 122, etc.

A plurality of piezoelectric patterns PP is disposed in the third area A3 of the lower substrate 110. For example, the piezoelectric patterns PP are disposed adjacent to the end of the additional connection substrate CSA. A plurality of grooves is formed in the lower substrate 110 in the third areas A3, and the piezoelectric patterns PP are arranged in the grooves.

If the piezoelectric patterns PP are disposed on the upper surface of the lower substrate 110, stress is applied to the piezoelectric patterns PP when the stretchable display device 100 is stretched, such that the piezoelectric patterns PP may be broken, peeled, or scattered. Thus, the piezoelectric patterns PP are disposed in the grooves, thereby suppressing cracking, peeling and scattering of the piezoelectric patterns PP when the stretchable display device 100 is stretched.

The piezoelectric patterns PP are elements that convert mechanical energy into electrical energy. For example, when an external force, i.e., stress is applied to the piezoelectric patterns PP, a voltage may be generated from the piezoelectric patterns PP.

Because the piezoelectric patterns PP are disposed in the grooves of the lower substrate 110 in the third areas A3, which are the flexible region, an external force may be applied to the lower substrate 110 and the piezoelectric patterns PP seated on the lower substrate 110 when the stretchable display device 100 is stretched. When the stretchable display device 100 is stretched, mechanical energy is applied to the piezoelectric patterns PP from the external force, and electric energy may be generated from the piezoelectric patterns PP. Therefore, when the stretchable display device 100 is stretched, the external force, e.g., stress may be applied to the piezoelectric patterns PP, to generate a voltage.

When the stress is applied to the piezoelectric patterns PP, the voltage generated from the piezoelectric patterns PP may temporarily have the maximum value immediately after the stress is applied, and then the voltage may thereafter drop and converge to a certain voltage. For example, when the stress is applied to the piezoelectric patterns PP, the maximum voltage may be instantly be generated from the piezoelectric patterns PP. After the maximum voltage is generated, the voltage generated may sharply drop. The voltage value generated from the piezoelectric patterns PP may not decrease continuously but may converge to a certain voltage value. The voltage value to which the voltage generated from the piezoelectric pattern PP finally converges may be defined as a first voltage. Accordingly, when the stress is applied to the piezoelectric patterns PP, the first voltage may be generated from the piezoelectric patterns PP.

When the stress is removed from the piezoelectric patterns PP, the voltage generated from the piezoelectric patterns PP may have the maximum value of the opposite polarity immediately after the stress is removed, and thereafter may become floating. For example, when the stress is removed from the piezoelectric patterns PP, the maximum voltage may be instantly be generated from the piezoelectric patterns PP. The maximum voltage thus generated may have a polarity opposite to that of the maximum voltage generated immediately after stress is applied to the piezoelectric patterns PP. Then, the piezoelectric patterns PP may be floating. Therefore, when no stress is applied to the piezoelectric patterns PP, the piezoelectric patterns PP may be floating.

In summary, when the stretchable display device 100 is not stretched, the piezoelectric patterns PP may be floating because no mechanical energy, that is, stress is applied to the piezoelectric patterns PP. On the other hand, when the stretchable display device 100 is stretched, the piezoelectric patterns PP may generate the first voltage because mechanical energy, that is, stress is applied to the piezoelectric patterns PP.

The maximum voltage generated from the piezoelectric patterns PP may be proportional to the size of the piezoelectric patterns PP. For example, when the length of the piezoelectric patterns PP is approximately 2 cm, the maximum voltage generated from the piezoelectric patterns PP may be approximately 8V. When the length of the additional light-emitting elements 140A disposed on the piezoelectric patterns PP is approximately 500 μm and the length of the piezoelectric patterns PP is equal to the length of the additional light-emitting elements 140A, the maximum voltage generated from the piezoelectric patterns PP may be approximately 0.2 V. For example, as described above, when the length of the piezoelectric patterns PP is 2 cm, the maximum voltage is 8 V, and when the length of the piezoelectric patterns PP is 500 μm, the max voltage is 0.2 V, which is reduced as the length is reduced.

Thus, according to this example, the maximum voltage of the piezoelectric patterns PP is approximately 0.2 V, and the first voltage is 0 V as described above. Accordingly, the difference between the maximum voltage and the first voltage may be very small. Therefore, the additional light-emitting element 140A may emit light not only when the first voltage is generated in the piezoelectric patterns PP, but also during the period the maximum voltage converges to the first voltage. That is to say, the additional light-emitting elements 140A can emit light simultaneously as the stretchable display device 100 is stretched, rather than after the stretchable display device 100 is stretched. Accordingly, the additional light-emitting elements 140A can compensate for the decrease in the luminance without delay when the stretchable display device 100 is stretched.

The additional light-emitting element 140A is disposed in the third area A3 of the lower substrate 110. The additional light-emitting element 140A is disposed on the additional connection substrate CSA, the additional connection line 150A and the piezoelectric patterns PP. The additional light-emitting element 140A is disposed in each of the additional sub-pixels SPXA and emits light in a part wavelength range. The additional light-emitting element 140A may be substantially identical to the elements 140 disposed in each of the sub-pixels SPX.

The additional light-emitting element 140A includes a first additional semiconductor layer 141A, an additional emissive layer 142A, a second additional semiconductor layer 143A, a first additional electrode 144A and a second additional electrode 145A.

The first additional electrode 144A is disposed on one end of the additional connection line 150A, and the second additional electrode 145A is disposed on the piezoelectric patterns PP. Each of the first additional electrode 144A and the second additional electrode 145A is electrically connected to the additional connection lines 150A and the piezoelectric patterns PP. The first additional electrode 144A may transfer a voltage from the first drain electrode 124 of the first transistor 120 to the first additional semiconductor layer 141A. When a stress is applied the piezoelectric pattern PP, the second additional electrode 145A may transfer the first voltage from the piezoelectric pattern PP to the second additional semiconductor layer 143A.

A plurality of additional bonding patterns BPA is disposed between the first additional electrode 144A and the additional connection line 150A, and between the second additional electrode 145A and the piezoelectric pattern PP. The additional bonding patterns BPA are media for bonding the additional light-emitting elements 140A onto the additional connection lines 150A and the piezoelectric patterns PP. For example, the additional bonding patterns BPA may be, but are not limited to, gold (Au) bumps or solder bumps.

The additional bonding patterns BPA include a first additional bonding pattern BP1A and a second additional bonding pattern BP2A. The first additional bonding pattern BP1A is disposed between the additional connection line 150A and the first additional electrode 144A, and the second additional bonding pattern BP2A is disposed between the piezoelectric pattern PP and the second additional electrode 145A. The additional light-emitting elements 140A may be bonded onto the third area A3 of the lower substrate 110 via the additional bonding patterns BPA. In addition, the second additional bonding pattern BP2A may compensate for the step difference between the second additional electrode 145A and the piezoelectric pattern PP.

On the other hand, the second additional bonding pattern BP2A disposed between the second additional electrode 145A and the piezoelectric pattern PP not only electrically connects the piezoelectric pattern PP with the second additional electrode 145A, but also includes the same material as the piezoelectric pattern PP to supply a voltage to the additional light-emitting elements 140A when a stress is applied.

The first additional semiconductor layer 141A is disposed on the first additional electrode 144A, and a second additional semiconductor layer 143A is disposed on the first additional semiconductor layer 141A. The first additional semiconductor layer 141A and the second additional semiconductor layer 143A may be formed by implanting n-type or p-type impurities into gallium nitride (GaN). For example, the first additional semiconductor layer 141A may be a p-type semiconductor layer formed by implanting p-type impurities into gallium nitride, and the second additional semiconductor layer 143A may be an n-type semiconductor layer formed by implanting n-type impurities into gallium nitride. The p-type impurities may be, but are not limited to, magnesium (Mg), zinc (Zn), beryllium (Be), etc. The n-type impurities may be, but are not limited to, silicon (Si), germanium (Ge), tin (Sn), etc.

The additional emissive layer 142A is disposed between the first additional semiconductor layer 141A and the second additional semiconductor layer 143A. The additional emissive layer 142A may receive holes and electrons from the first additional semiconductor layer 141A and the second additional semiconductor layer 143A to emit light. The additional emissive layer 142A may be made up of a single layer or a multi-quantum well (MQW) structure. For example, the additional emissive layer 142A may be made of, but is not limited to, indium gallium nitride (InGaN) or gallium nitride (GaN).

A part of the second additional semiconductor layer 143A protrudes outwardly from the additional emissive layer 142A and the first additional semiconductor layer 141A. In other words, the additional emissive layer 142A and the first additional semiconductor layer 141A may be smaller than the second additional semiconductor layer 143A such that the lower surface of the second additional semiconductor layer 143A is exposed. The second additional semiconductor layer 143A may be exposed from the additional emissive layer 142A and the first additional semiconductor layer 141A in order to be electrically connected to the piezoelectric pattern PP.

When the stretchable display device 100 is turned on, the light-emitting elements 140 on the island substrates 111 may be turned on. For example, voltages of different levels may be applied to the first drain electrode 124 of the first transistor 120 and the common line CL electrically connected to the light-emitting elements 140. A voltage from the first drain electrode 124 of the first transistor 120 may be applied to the first electrode 144 of the light-emitting element 140, and a common voltage from the common line CL may be applied to the second electrode 145. As voltages of different levels are applied to the first electrode 144 and the second electrode 145 of the light-emitting element 140, current flows through the emissive layer 142 so that the light-emitting element 140 can emit light.

The first drain electrode 124 of the first transistor 120, which is connected to each of the light-emitting elements 140 on the island substrates 111 in the first area A1, may also be electrically connected to each of the additional light-emitting elements 140A on the third area A3 adjacent to the first area A1 in the diagonal direction. The light-emitting elements 140 on the island substrates 111 and the additional light-emitting elements 140A in the third area A3 may be electrically connected to the first drain electrodes 124 of the same first transistor 120. That is to say, one light-emitting element 140 and one additional light-emitting element 140A may be electrically connected to the first drain electrode 124 of one first transistor 120. Therefore, when a voltage from the first drain electrode 124 of the first transistor 120 is applied to the first electrode 144 of a light-emitting element 140 to emit light from the light-emitting element 140, the same voltage may also be applied to the first additional electrode 144A of an additional light-emitting element 140A simultaneously.

Even if the voltage from the first drain electrode 124 is applied to the first additional electrode 144A, however, the additional light-emitting element 140A may emit light only if a voltage that is high enough to drive the additional light-emitting element 140A is applied to the second additional electrode 145A so that a current flows through the additional emissive layer 142A.

The second additional electrode 145A of the additional light-emitting element 140A is electrically connected to each of the piezoelectric patterns PP as described above. If an external force generated when the stretchable display device 100 is stretched is applied to the piezoelectric patterns PP, the first voltage may be generated from the piezoelectric patterns PP. Accordingly, when the light-emitting element 140 associated with an additional light-emitting element 140A emits light, the additional light-emitting element 140A may also emit light together with the light-emitting element 140 if the first voltage is generated from the piezoelectric pattern PP as the stretchable display device 100 is stretched. Therefore, when the stretchable display device 100 is stretched, the additional light-emitting element 140A associated with the light-emitting element 140 among the light-emitting elements may also emit light The first voltage generated from the piezoelectric pattern PP may be a voltage of a level different from the voltage of the first drain electrode 124. For example, the first voltage may be 0 V.

With reference to FIG. 3, the upper substrate 160 is disposed above the lower substrate 110. For example, the upper substrate 160 is disposed above the light-emitting elements 140 and the additional light-emitting elements 140A of the lower substrate 110. The upper substrate 160 supports a variety of elements disposed thereunder. The upper substrate 160 may be made of an insulating material that may be bent or stretched as a flexible substrate. The upper substrate 160 may be a flexible substrate and may be reversibly expanded and contracted. In addition, the elastic modulus may be several MPa to several hundred MPa, and the elongation at break may be 100% or higher. The thickness of the upper substrate 160 may be, but is not limited to, 10 µm to 1 mm.

The upper substrate 160 may be made of the same material as the lower substrate 110. For example, the upper substrate 110 may be made of an elastomer including a silicone rubber such as polydimethylsiloxane (PDMS) and a polyurethane (PU), and accordingly may have flexibility. It is, however, to be understood that the material of the upper substrate 160 is not limited thereto.

By pressing the upper substrate 160 against the lower substrate 110, the upper substrate 160 and the lower substrate 110 may be attached together by an adhesive layer 117 disposed under the upper substrate 160. It is, however, to be understood that the present disclosure is not limited thereto. In some implementations, the adhesive layer 117 may be eliminated.

The polarizing layer 190 is disposed on the upper substrate 160. The polarizing layer 190 may polarize light incident from the outside of the stretchable display device 100. The polarized light that has passed through the polarizing layer 190 and is incident into the stretchable display device 100 may be reflected inside the stretchable display device 100 and the phase may be shifted accordingly. As the phase of the light is shifted, the light may not pass through the polarization layer 190. As a result, the light incident from the outside of the stretchable display device 100 into the inside of the stretchable display device 100 cannot exit to the outside of the stretchable display device 100, and thus the reflection of the external light may be reduced.

In the stretchable display device 100 according to the example embodiment of the present disclosure, the additional pixels PXA are disposed in the third areas A3, which are dummy portions of the lower substrate 110 that have no function, e.g., the areas other than the first areas A1 where the island substrates 111 are disposed and the second areas A2 where the connection lines 150 are disposed. By doing so, the third area A3 of the stretchable display device 100 may be efficiently utilized, and the aperture ratio of the stretchable display device 100 may be improved. For example, by disposing the additional pixels PXA in the stretchable display device 100, the aperture ratio may be increased as shown in FIG. 2. As a result, the luminance of the stretchable display device 100 according to the example embodiment of the present disclosure may be improved as well.

In the stretchable display device 100 according to the example embodiment of the present disclosure, the first transistors 120 disposed on the island substrates 111 are shared by the pixels PX and the additional pixels PXA, so that the additional pixels PXA may be easily operated. While the first transistor 120 is driven so that the light-emitting element 140 emits light, the additional light-emitting element 140A connected to the same first transistor 120 may emit light simultaneously when the stretchable display device 100 is stretched. In this manner, in the stretchable display device 100 according to the example embodiment of the present disclosure, the light-emitting element 140 and the additional light-emitting element 140A share the same first transistor 120 disposed on each of the island substrates 111, and thus the additional light-emitting elements 140A may emit light easily without any additional circuitry. In addition, the aperture ratio of the stretchable display device 100 may be improved.

In addition, in the stretchable display device 100 according to the example embodiment of the present disclosure, the additional pixels PXA are formed in the third areas A3, and it may be possible to suppress deterioration of image quality and mura artifacts such as a lattice pattern of the stretchable display device 100 when it is stretched. For example, a voltage is applied to the first additional electrode 144A of the additional light-emitting element 140A from the first drain electrode 124 of the first transistor 120, but the piezoelectric pattern PP is floating, and thus, no separate voltage may be applied to the second additional electrode 145A. Therefore, when the distance between the island substrates 111 is at a minimum when the stretchable display device 100 is not stretched, the additional light-emitting elements 140A between the island substrates 111 do not emit light, and only the light-emitting elements 140 on the island substrates 111 may emit light. On the other hand, when the stretchable display device 100 is stretched, the regions between the island substrates 111 are stretched, so that the distance between the island substrates 111 may be increased before it is stretched. Thus, when the stretchable display device 100 is stretched, the luminance in the regions between the island substrates 111 is lowered, such that mura artifacts such as a lattice pattern may be perceived, and the image quality may be deteriorated. Accordingly, the stretchable display device 100 according to the example embodiment of the present disclosure may drive the light-emitting element 140 as well as the additional light-emitting element 140A connected to the same first transistor 120 when the stretchable display device 100 is stretched. For example, when the stretchable display device 100 is stretched and one light-emitting element 140 is driven by the first transistor 120, a voltage from the first drain electrode 124 of the first transistor 120 is applied to the first additional electrode 144A of the additional light-emitting element 140A connected to the same first transistor 120, and a first voltage generated in the piezoelectric pattern PP by the stress is applied to the second additional electrode 145A. Thus, when the stretchable display device 100 is stretched and the distance between the island substrates 111 is increased, the additional light-emitting element 140A between the island substrates 111 emits light, so that it may be possible to compensate for the decrease in luminance caused as the distance between the light-emitting elements 140 is increased. That is to say, when the stretchable display device 100 is stretched, the additional light-emitting elements 140A compensate for the increased distance between the light-emitting elements 140, so that the distance between the light-emitting 140 looks normal. Therefore, in the stretchable display device 100 according to the example embodiment of the present disclosure, it may be possible to suppress the distortion of images when the stretchable display device 100 is stretched and to reduce mura artifacts such as a lattice pattern.

Figure 4:
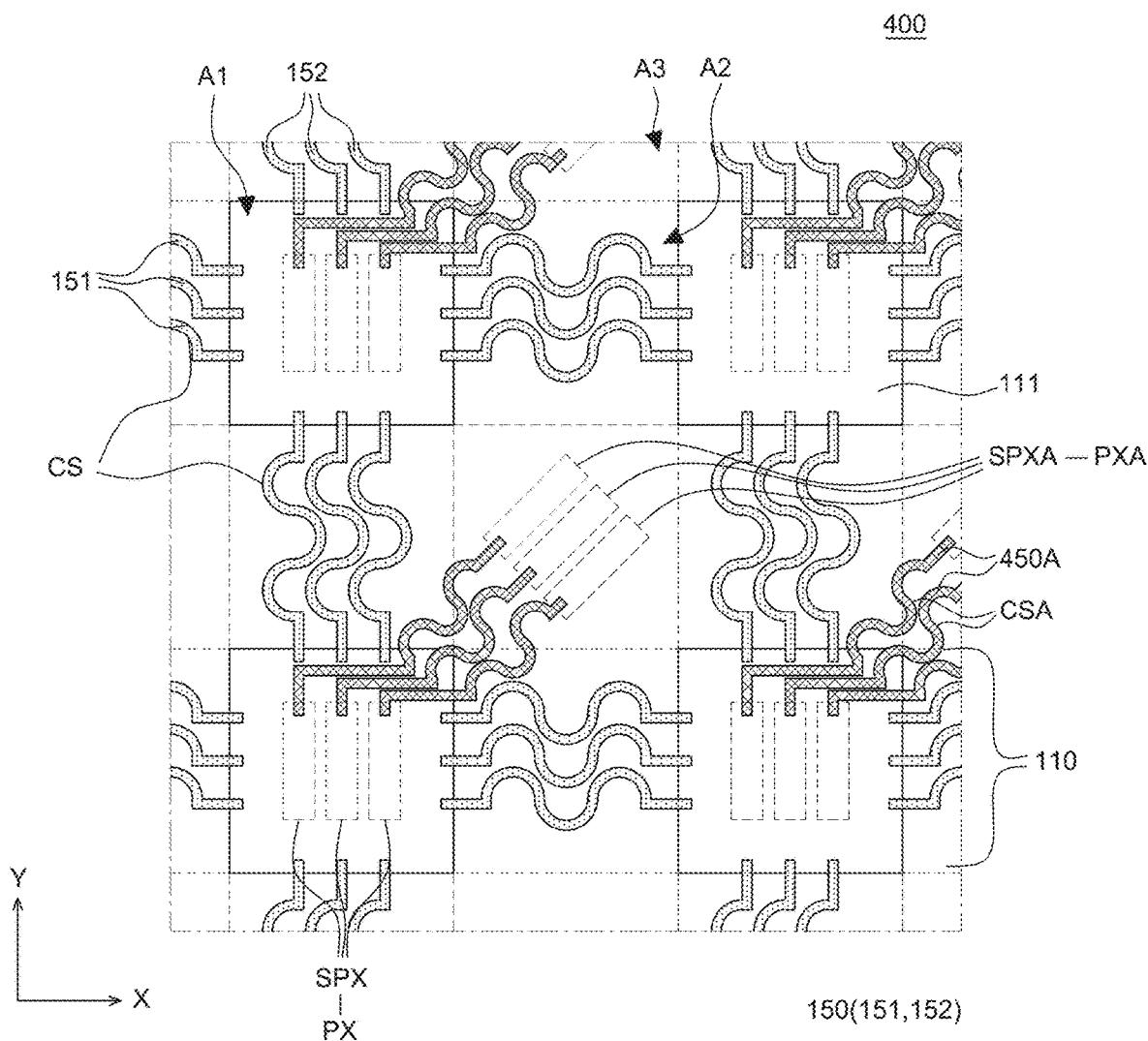
FIG. 4 is an enlarged plan view of a stretchable display device according to another example embodiment of the present disclosure.
Figure 5:
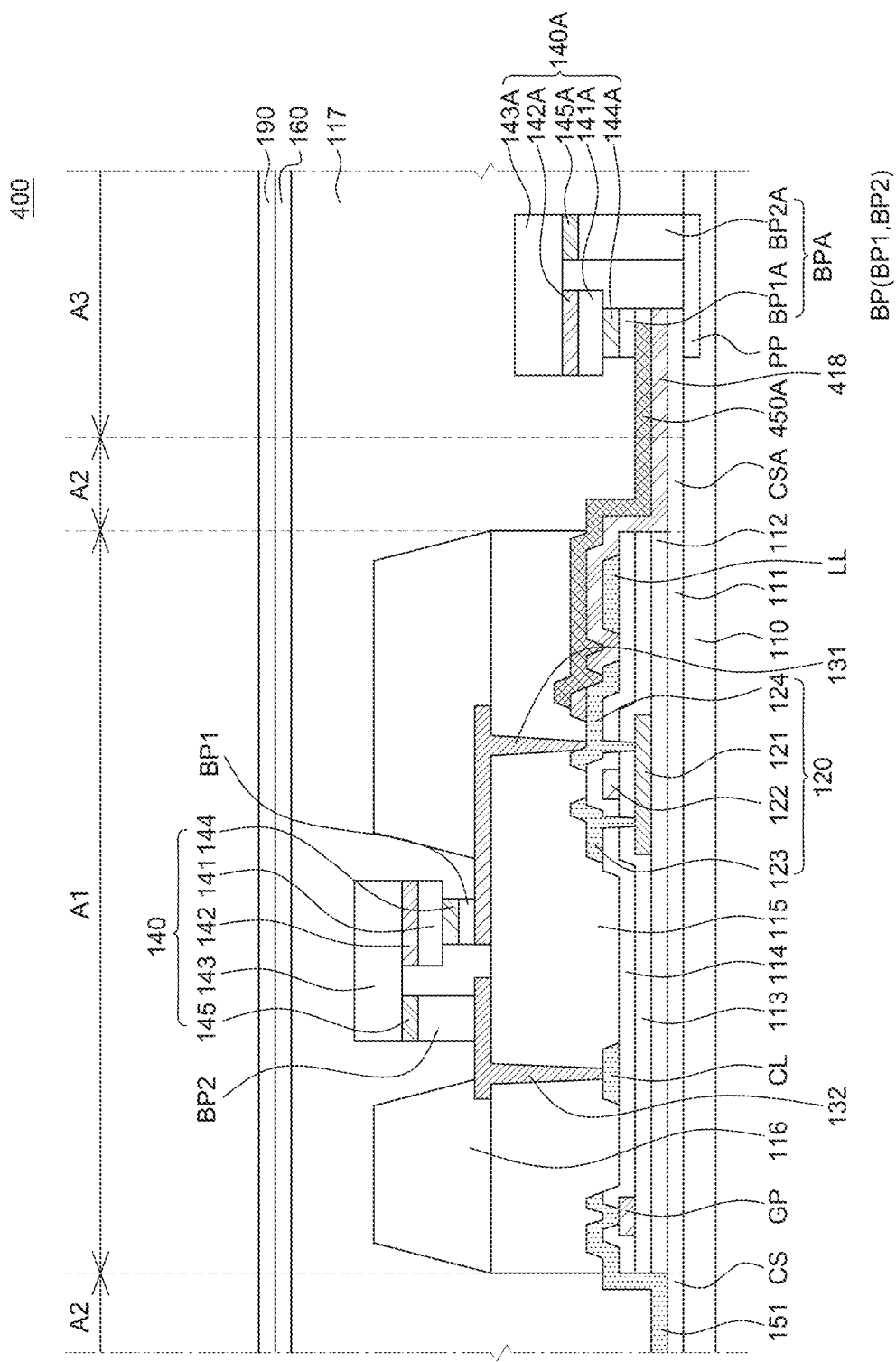
FIG. 5 is a schematic cross-sectional view of sub-pixels and additional sub-pixels of a stretchable display device according to another example embodiment of the present disclosure.

FIG. 4 is an enlarged plan view of a stretchable display device according to another example embodiment of the present disclosure. FIG. 5 is a schematic cross-sectional view of sub-pixels and additional sub-pixels of a stretchable display device according to another example embodiment of the present disclosure. A stretchable display device 400 according to the example embodiment shown in FIGS. 4 and 5 may be substantially identical to the stretchable display device 100 shown in FIGS. 1 to 3, except that additional connection lines 450A are different and an additional insulating layer 418 and an additional line LL are further included. Therefore, the redundant description will be omitted.

With reference to FIGS. 4 and 5, an additional line LL is disposed on the interlayer dielectric layer 114. The additional line LL may be made of, but is not limited to, the same material as the first source electrode 123 and the first drain electrode 124 of the first transistor 120.

The additional line LL is disposed on the island substrates 111 and may transfer a variety of signals to the sub-pixels SPX. The additional line LL may be, but is not limited to, a gate line, a data line, a high-voltage supply line, a low-voltage supply line, a reference voltage line, a common line CL, etc.

The additional insulating layer 418 is disposed on the additional line LL to cover it. The additional insulating layer 418 may be disposed to cover the first drain electrode 124 and the additional line LL. The additional insulating layer 418 may be extended to the outside of the island substrates 111 and may cover the additional connection substrate CSA. The additional insulating layer 418 may include a contact hole for electrically connecting the first drain electrode 124 of the first transistor 120 with the additional connection line 450A.

Because the additional insulating layer 418 may be made of an insulating material and is extended to the additional connection substrate CSA in the third area A3, which is the flexible region, it may be made of an insulating material having flexibility. For example, the additional insulating layer 418 may be made of the same material as the island substrates 111 and the additional connection substrates CSA, but the present disclosure is not limited thereto.

Although the additional insulating layer 418 is extended to the outside of the island substrates 111 in the example shown in FIG. 5, the additional insulating layer 418 may be disposed only on the island substrates 111. In such case, the additional insulating layer 418 may be made up of, but is not limited to, a single layer of silicon nitride (SiNx) or silicon oxide (SiOx) which is an inorganic material having insulating properties, or multiple layers of silicon nitride (SiNx) and silicon oxide (SiOx).

The additional connection line 450A is disposed on the additional insulating layer 418. The additional connection line 450A is disposed on the upper surface of the additional insulating layer 418 and is extended from the island substrates 111 to the third area A3. The additional connection line 450A may be in contact with the first drain electrode 124 through the contact hole of the additional insulating layer 418, and the additional connection line 450A may be electrically connected to the first drain electrode 124. One end of the additional connection line 450A extended to the third area A3 may be electrically connected to the first additional electrode 144A of the additional light-emitting element 140A in the third area A3 through a plurality of additional bonding patterns BPA. Accordingly, the additional connection line 450A may transfer the voltage from the first drain electrode 124 of the first transistor 120 on the island substrates 111 to the additional light-emitting element 140A of the third area A3.

In the stretchable display device 400 according to another example embodiment of the present disclosure, the additional insulating layer 418 is disposed between the lines disposed on the island substrate 111 and the additional connection line 450A extended from the island substrate 111 to the third area A3, so that it may be possible to prevent a short-circuit from being formed between the lines and additional connection lines 450A. A variety of lines made of a metal material are disposed only on the island substrates 111. For example, a variety of lines such as a gate line, a data line, a high-voltage supply line, a low-voltage supply line, a reference voltage line and a common line CL may be disposed only on the island substrates 111. In addition, the additional connection lines 450A may be electrically connected to the first drain electrode 124 of the first transistor 120 on the islands 111 to transfer a voltage from the first transistor 120 to the additional light-emitting element 140A. A line may be disposed on the same plane as the first drain electrode 124 of the first transistor 120 among various lines of the island substrate 111. For example, the first drain electrode 124 and the additional line LL may be disposed on the same plane. Accordingly, an additional insulating layer 418 may be further disposed to cover the additional line LL so that the additional connection line 450A extended to the outside of the island substrate 111 from the first drain electrode 124 is not in contact with the additional line LL. The additional insulating layer 418 may be disposed from the island substrate 111 to the additional connection substrate CSA to thereby insulate the additional connection line 450A extended to the outside of the island substrate 111 from the first drain electrode 124 from a variety of lines on the island substrate 111. The additional insulating layer 418 may be made of an insulating material and may be made of the same material as, for example, the island substrates 111 and the additional connection substrates CSA. Accordingly, in the stretchable display device 400 according to another example embodiment of the present disclosure, a variety of lines on the island substrates 111 are insulated from the additional connection line 450A extended to the third area A3 from the island substrates 111, thereby improving the reliability of the stretchable display device 400.

Figure 6:
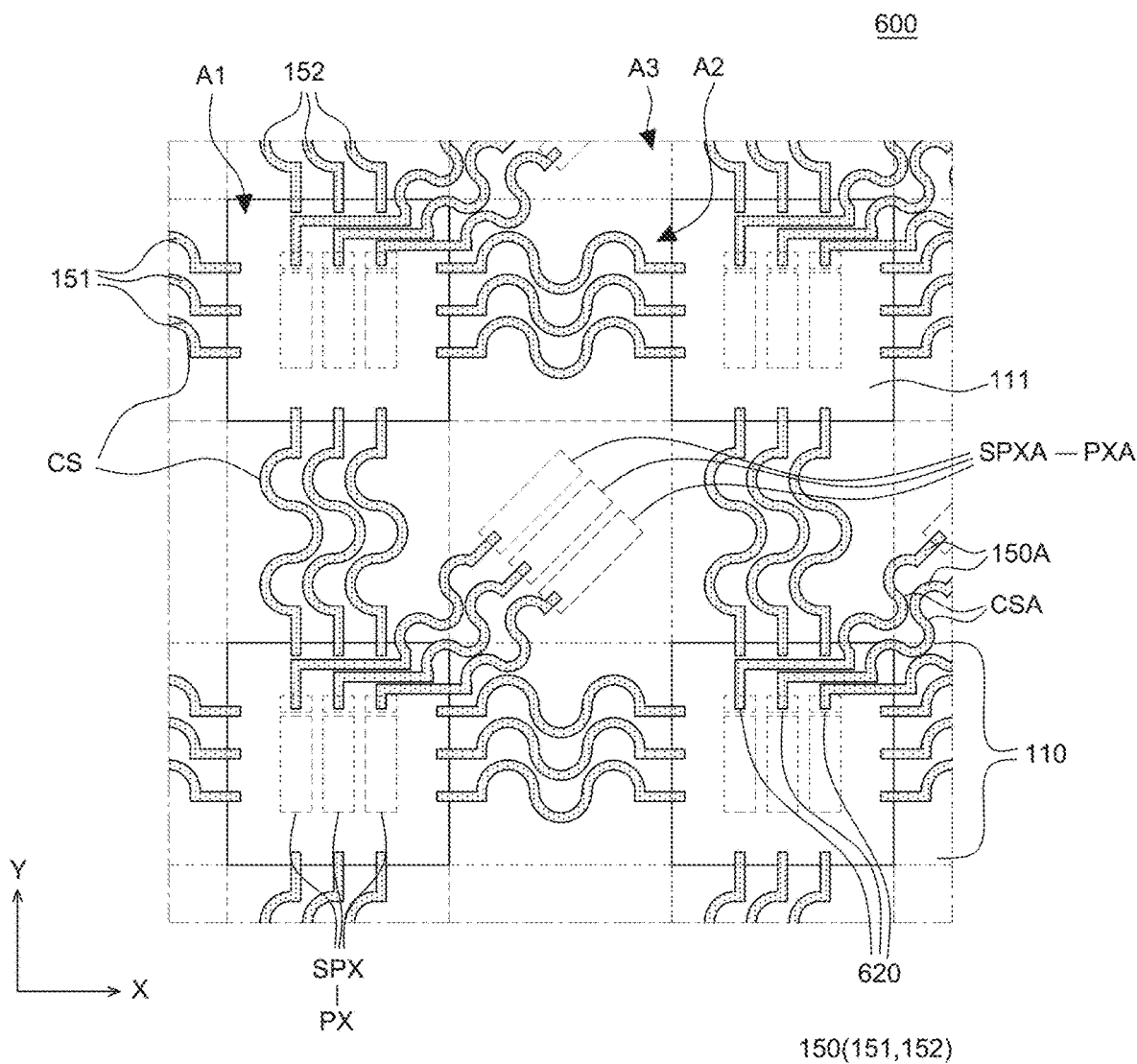
FIG. 6 is an enlarged plan view of a stretchable display device according to yet another example embodiment of the present disclosure.
Figure 7:
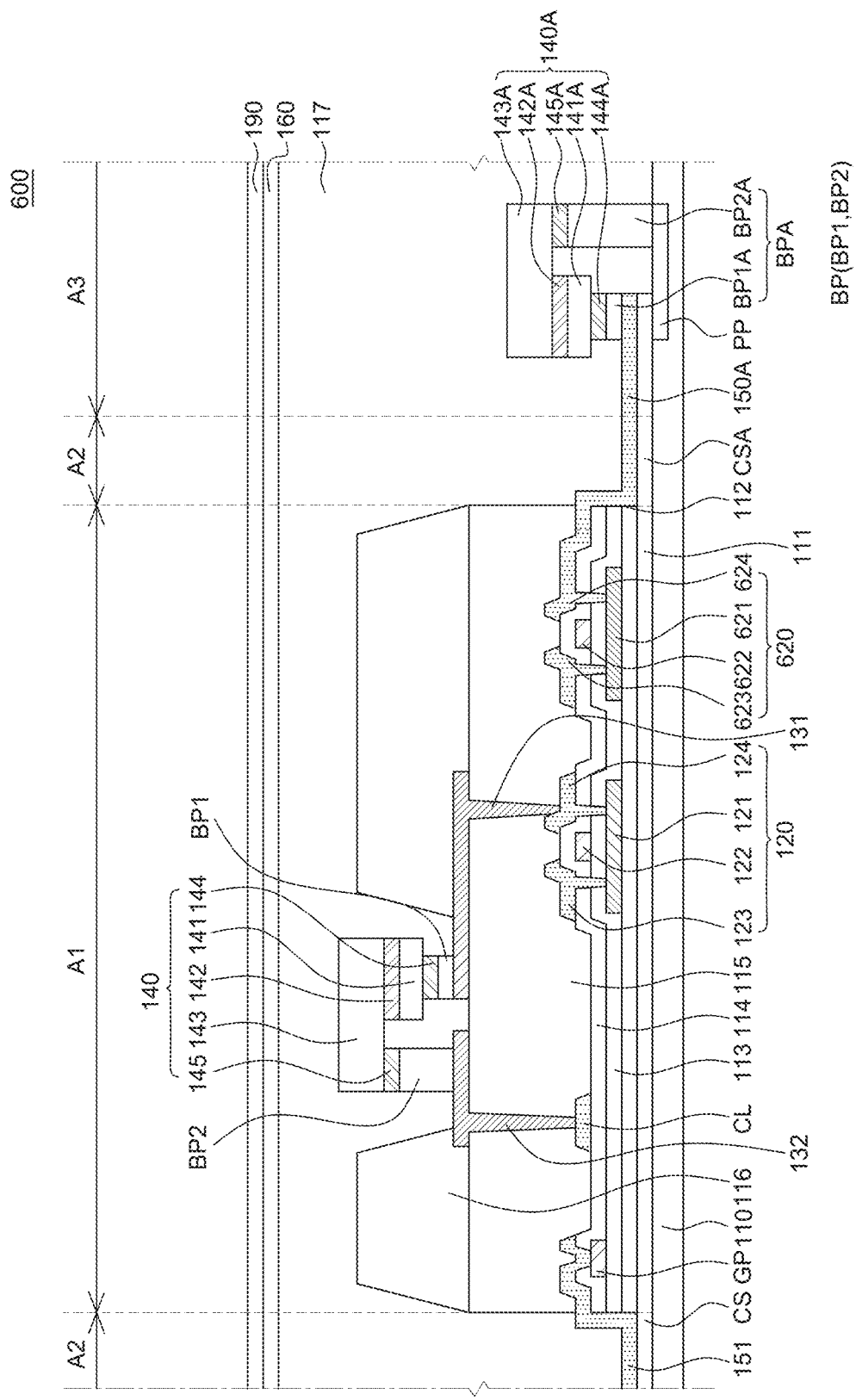
FIG. 7 is a schematic cross-sectional view of sub-pixels and additional sub-pixels of a stretchable display device according to yet another example embodiment of the present disclosure.

FIG. 6 is an enlarged plan view of a stretchable display device according to yet another example embodiment of the present disclosure. FIG. 7 is a schematic cross-sectional view of sub-pixels and additional sub-pixels of a stretchable display device according to yet another example embodiment of the present disclosure. A stretchable display device 600 according to the example embodiment shown in FIGS. 6 and 7 may be substantially identical to the stretchable display device 100 shown in FIGS. 1 to 3, except that the former further includes a second transistor 620. Therefore, the redundant description will be omitted.

With reference to FIGS. 6 and 7, second transistors 620 are disposed on the respective island substrates 111. Each of the second transistors 620 includes a second active layer 621, a second gate electrode 622, a second source electrode 623 and a second drain electrode 624.

Initially, the second active layer 621 is disposed on the buffer layer 112. For example, the second active layer 621 may be formed of an oxide semiconductor or may be formed of an amorphous silicon (a-Si), a polycrystalline silicon (poly-Si), an organic semiconductor, or the like.

A gate insulating layer 113 is disposed on the second active layer 621. The gate insulating layer 113 electrically isolates the second gate electrode 622 from the second active layer 621 and may be made of an insulating material. For example, the gate insulating layer 113 may be made up of a single layer of silicon nitride (SiNx) or silicon oxide (SiOx), which is an inorganic material, or multiple layers of silicon nitride (SiNx) and silicon oxide (SiOx). It is, however, to be understood that the present disclosure is not limited thereto.

The second gate electrode 622 is disposed on the gate insulating layer 113. The second gate electrode 622 overlaps with the second active layer 621. The second gate electrode 622 may be formed of, but is not limited to, one of a variety of metal materials including molybdenum (Mo), aluminum (Al), chromium (Cr), gold (Au), titanium (Ti), nickel (Ni), neodymium (Nd) and copper (Cu), an alloy of two or more thereof, or multiple layers thereof.

The interlayer dielectric layer 114 is disposed on the second gate electrode 622. The interlayer dielectric layer 114 insulates the second gate electrode 622 from the second source electrode 623 and the second drain electrode 624 and may be made of an inorganic material, like the buffer layer 112. For example, the interlayer dielectric layer 114 may be made up of a single layer of silicon nitride (SiNx) or silicon oxide (SiOx) which is an inorganic material, or multiple layers of silicon nitride (SiNx) and silicon oxide (SiOx). It is, however, to be understood that the present disclosure is not limited thereto.

The second source electrode 623 and the second drain electrode 624, which are in contact with the second active layer 621, are disposed on the interlayer dielectric layer 114. The second source electrode 623 is spaced apart from the second drain electrode 624 on the same layer. The second source electrode 623 and the second drain electrode 624 may be electrically connected to the second active layer 621 by being in contact with the second active layer 621. The second source electrode 623 and the second drain electrode 624 may be formed of, but are not limited to, one of a variety of metal materials including molybdenum (Mo), aluminum (Al), chromium (Cr), gold (Au), titanium (Ti), nickel (Ni), neodymium (Nd) and copper (Cu), an alloy of two or more thereof, or multiple layers thereof.

The additional connection substrate CSA and the additional connection line 150A extended from the island substrate 111 in the first area A1 to the third area A3 are disposed on the lower substrate 110. The additional connection line 150A may be extended from the second drain electrode 624 of the second transistor 620 on the island substrate 111 to the third area A3. The additional connection line 150A may be formed integrally with the second drain electrode 624 and may be extended to the third area A3. Accordingly, the additional connection line 150A may be electrically connected to the second drain electrode 624 of the second transistor 620 and may transfer the voltage from the second drain electrode 624 to the additional light-emitting elements 140A connected to the additional connection line 150.

The first transistor 120 and the second transistor 620 may operate individually. For example, voltages from different lines may be applied to the first source electrode 123 of the first transistor 120 and the second source electrode 623 of the second transistor 620. A voltage may be applied to the first drain electrode 124 and the first electrode 144 of the light-emitting element 140 by a voltage applied to the first source electrode 123. A voltage may be applied to the second drain electrode 624 and the first additional electrode 144A of the additional light-emitting element 140A by a voltage applied to the second source electrode 623. The common voltage to the second electrode 145 of the light-emitting element 140 and the first voltage from the second additional electrode 145A of the additional light-emitting element 140A may have a fixed value. Accordingly, by adjusting the voltages applied to the first source electrode 123 of the first transistor 120 and the second source electrode 623 of the second transistor 620, it may be possible to control the brightness of light emitted from each of the light-emitting element 140 and the additional light-emitting element 140A.

The additional sub-pixels SPXA of the stretchable display device 600 according to yet another example embodiment of the present disclosure may be driven independently from the sub-pixels SPX disposed on the island substrates 111. For example, the light-emitting elements 140 on the island substrates 111 may be electrically connected to the first drain electrode 124 of the first transistor 120 to receive a voltage from the first drain electrode 124. Therefore, the light-emitting elements 140 on the island substrates 111 may be driven by receiving the voltage from the first transistor 120, and the additional light-emitting elements 140A on the third areas A3 may be driven by receiving the voltage from the second transistor 620. In this manner, in the stretchable display device 600 according to yet another example embodiment of the present disclosure, the sub-pixel SPX and the additional sub-pixel SPXA are independently driven to increase the resolution. In addition, when the stretchable display device 600 is stretched, the additional sub-pixels SPXA may be driven selectively to improve the quality of displayed images.

The stretchable display device 600 according to yet another example embodiment of the present disclosure can reduce a difference in luminance between the additional sub-pixels SPXA and the sub-pixels SPX. The first voltage applied to the second additional electrode 145A of the additional light-emitting element 140A and the common voltage applied to the second electrode 145 of the light-emitting element 140 may have the same value or different values. If there is a level difference between the first voltage and the common voltage and the same voltage is applied to the first transistor 120 and the second transistor 620, there may be a difference in luminance between the light-emitting element 140 and the additional light-emitting element 140A. In view of the above, in the stretchable display device 600 according to yet another example embodiment of the present disclosure, it may be possible to reduce the difference in luminance between the light-emitting element 140 and the additional light-emitting element 140A, even if there is a difference between the first voltage and the common voltage, by adjusting the voltage applied to the first transistor 120 and the second transistor 620. For example, with the common voltage applied to the second electrode 145 of the light-emitting element 140 fixed, by adjusting the voltage applied to the first electrode 144 of the light-emitting element 140 from the first transistor 120, it may be possible to adjust the difference in voltage level between the first electrode 144 and the second electrode 145, and to adjust the luminance of the light emitted from the light-emitting element 140. Furthermore, with the first voltage applied to the second additional electrode 145A of the additional light-emitting element 140A fixed, by adjusting the voltage applied to the first additional electrode 144A of the additional light-emitting element 140A from the second transistor 620, it may be possible to adjust the difference in voltage level between the first additional electrode 144A and the second additional electrode 145A, and to adjust the luminance of the light emitted from the additional light-emitting element 140A. Accordingly, in the stretchable display device 600 according to yet another example embodiment of the present disclosure, it may be possible to reduce the difference in luminance between the light-emitting element 140 and the additional light-emitting element 140A by individually driving the first transistor 120 and the second transistor 620.

Figure 8:
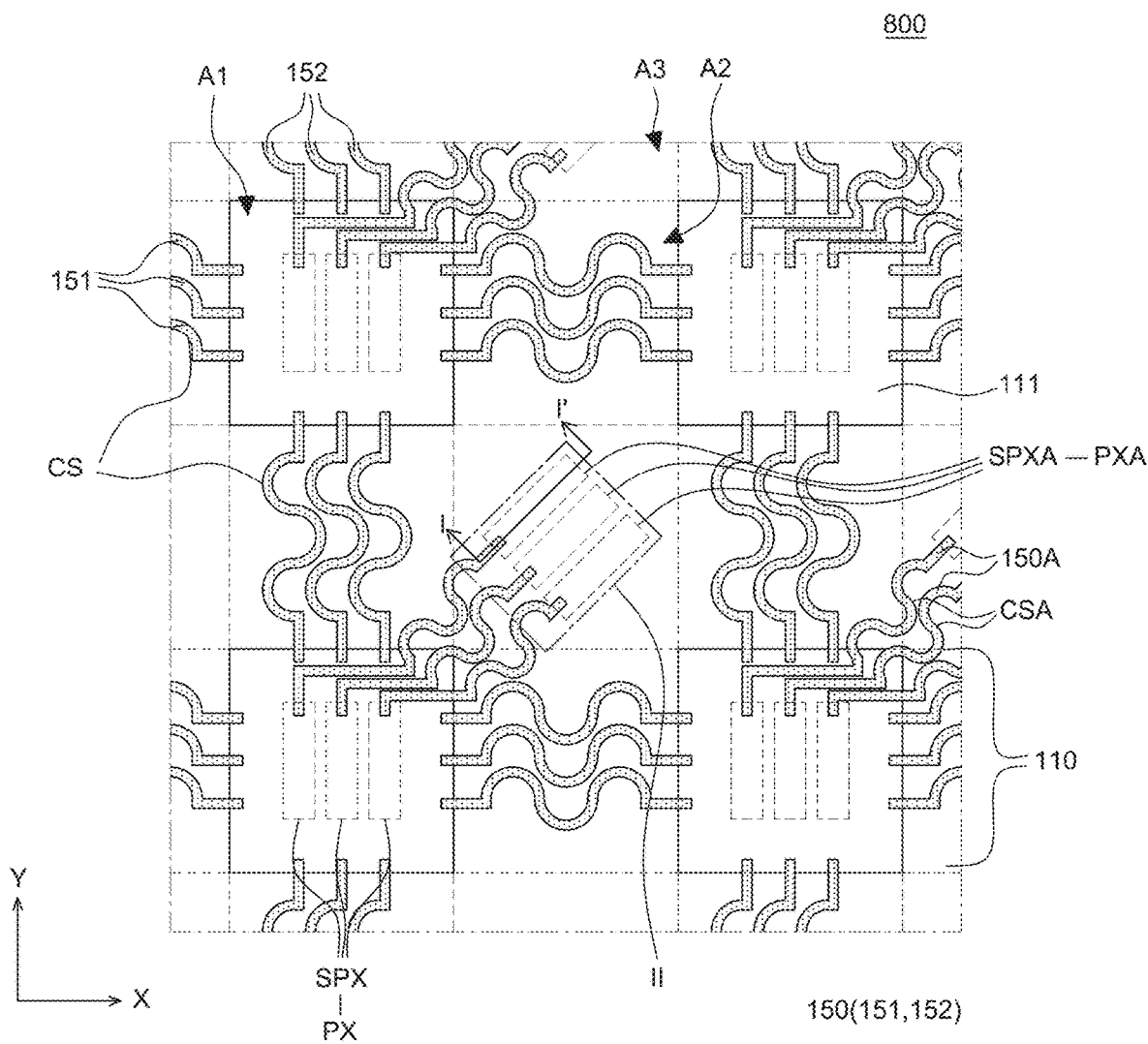
FIG. 8 is an enlarged plan view of a stretchable display device according to yet another example embodiment of the present disclosure.
Figure 9:
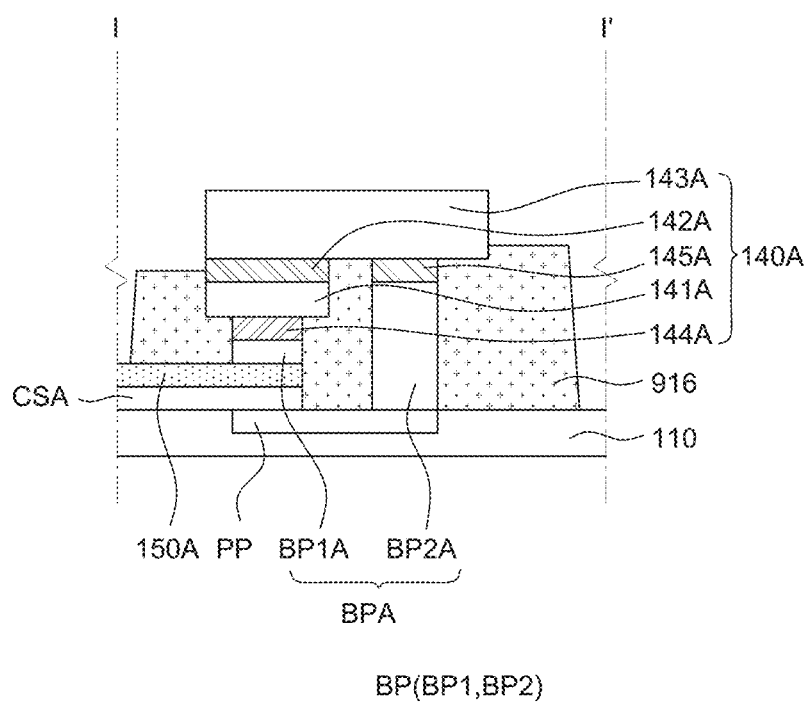
FIG. 9 is a schematic cross-sectional view of an additional sub-pixel of a stretchable display device according to yet another example embodiment of the present disclosure.
Figure 10A:
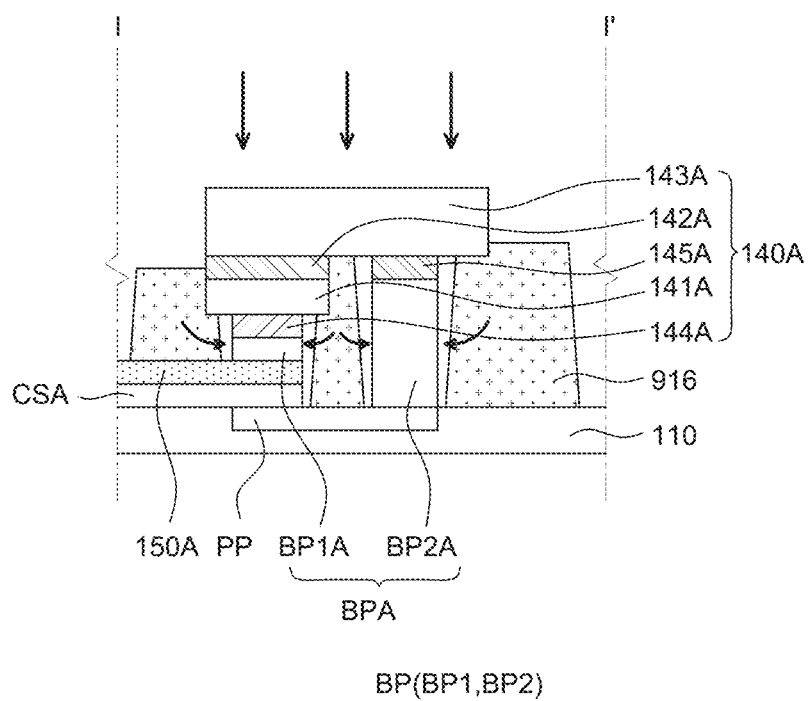
FIGS. 10A and 10B are views showing processing steps of fabricating a stretchable display device according to yet another example embodiment of the present disclosure.
Figure 10B:
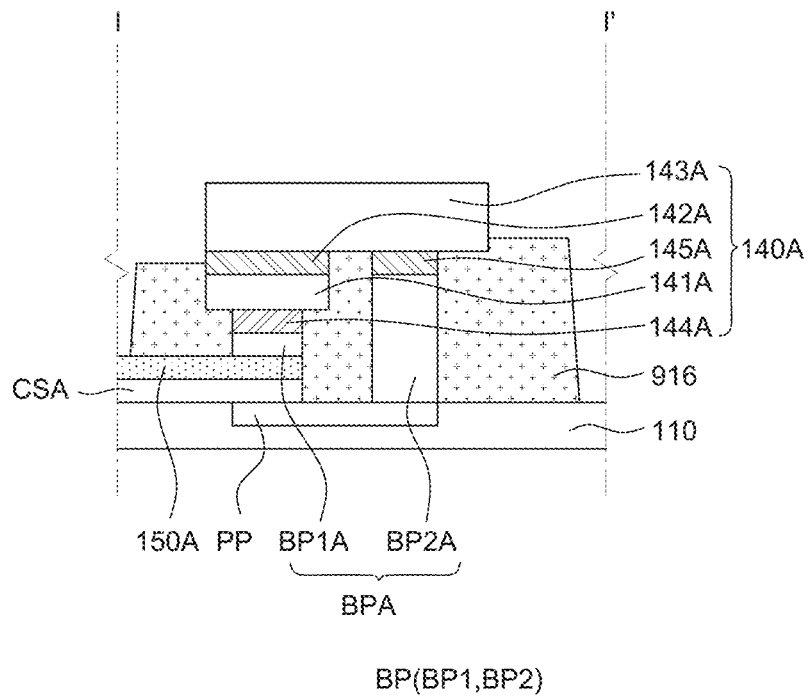
Figure 11A:
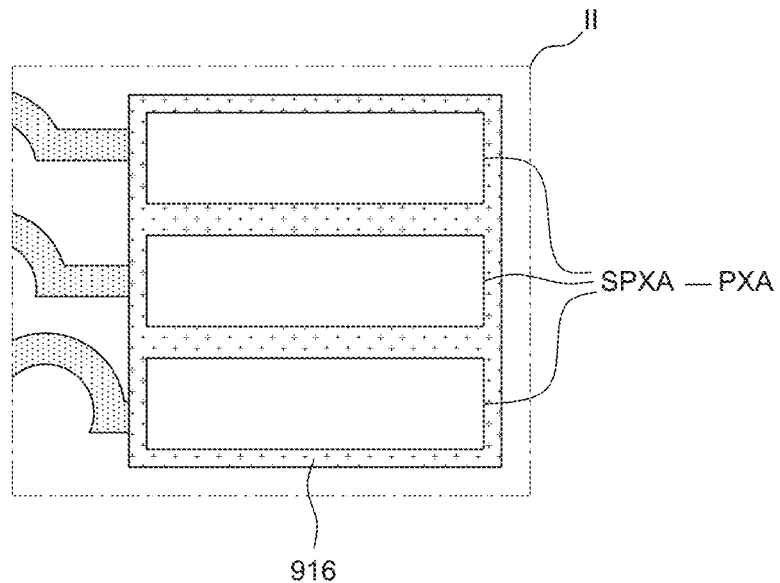
FIGS. 11A and 11B are schematic plan views of an additional sub-pixel according to yet another example embodiment of the present disclosure.
Figure 11B:
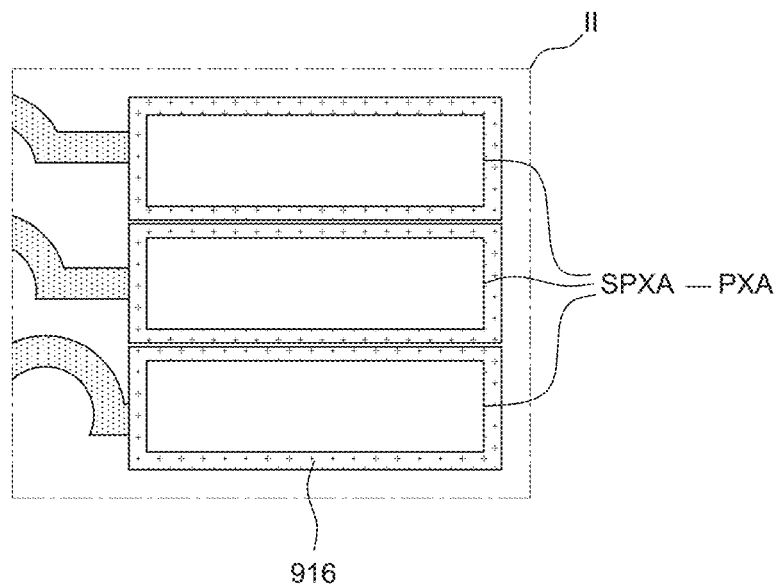

FIG. 8 is an enlarged plan view of a stretchable display device according to yet another example embodiment of the present disclosure. FIG. 9 is a schematic cross-sectional view of an additional sub-pixel of a stretchable display device according to yet another example embodiment of the present disclosure. FIGS. 10A and 10B are views showing processing steps of fabricating a stretchable display device according to yet another example embodiment of the present disclosure. FIGS. 11A and 11B are schematic plan views of an additional sub-pixel according to yet another example embodiment of the present disclosure.

A stretchable display device 800 according to the example embodiment shown in FIGS. 8 to 11B may be substantially identical to the stretchable display device 100 shown in FIGS. 1 to 3 except that the stretchable display device 800 shown in FIGS. 8 to 11B may further include a reinforcing layer 916. Therefore, redundant description will be omitted.

FIG. 9 is a cross-sectional view showing area I-I' of the stretchable display device 800 shown in FIG. 8. When the stretchable display device 800 shown in FIG. 8 is stretched, the third area A3 may be expanded by an external pressure. Accordingly, the additional light-emitting elements 140A disposed in the third area A3 may be less reliable than the light-emitting elements 140 disposed in the first area A1. The additional light-emitting elements 140A are fixed to the lower substrate 110 by the additional bonding patterns BPA. However, because the additional light-emitting elements 140A are continuously exposed to external stress, the adhesive force with the lower substrate 110 may be weakened. Accordingly, the reinforcing layer 916 may be disposed between the lower substrate 110 and the additional light-emitting elements 140A, so that the additional light-emitting elements 140A may be more firmly fixed to the lower substrate 110.

With reference to FIGS. 8 and 9, the reinforcing layer 916 is disposed in the third area A3 of the lower substrate 110. The reinforcing layer 916 may be made up of a single layer or multiple layers, and may be made of an organic material. For example, the reinforcing layer 916 may be made of, but is not limited to, an acryl-based organic material.

FIGS. 10A and 10B illustrate that the additional light-emitting elements 140A are firmly fixed to the lower substrate 110 by the reinforcing layer 916. Initially, the reinforcing layer 916 is formed in a region where additional sub-pixels SPXA are to be disposed on the lower substrate 110. The reinforcing layer 916 may be formed on the periphery of the region where the additional light-emitting elements 140A are to be disposed and on the piezoelectric pattern PP. In addition, the reinforcing layer 916 may be formed around the end of the additional connection substrate CSA. However, the reinforcing layer 916 may not overlap the first additional electrode 144A and the second additional electrode 145A.

After the reinforcing layer 916 is formed on the lower substrate 110, the additional light-emitting elements 140A are transferred to the additional sub-pixel SPXA area. At this time, when a pressure is applied from above the additional light-emitting elements 140A, the reinforcing layer 916 and the additional light-emitting elements 140A may be in tighter contact with each other. For example, as the gap between the reinforcing layer 916 and the additional light-emitting elements 140A is filled with the reinforcing layer 916, the rigidity of the region where the additional light-emitting elements 140A are located may increase. Accordingly, the additional light-emitting elements 140A may be safely protected even if the third area A3 is increased due to an external pressure.

The stretchable display device 800 shown in FIGS. 8 and 9 may further include an adhesive layer 117 on the lower substrate 110 on which the reinforcing layer 916 and the additional light-emitting elements 140A are disposed. The structure of the adhesive layer 117 may be substantially identical to that of the stretchable display device 100 shown in FIGS. 2 and 3. Therefore, redundant description will be omitted.

FIGS. 11A and 11B are enlarged plan views of area II of the stretchable display device 800 shown in FIG. 8. With reference to FIG. 11A, the reinforcing layer 916 may be disposed to overlap the plurality of additional sub-pixels SPXA. In addition, the reinforcing layer 916 may be disposed to surround the periphery of additional pixels SPA.

Therefore, the additional light-emitting elements 140A may be firmly fixed to the lower substrate 110.

With reference to FIG. 11B, a plurality of reinforcing layers 916 isolated from one another may be disposed in the additional pixel PXA area. That is to say, the reinforcing layers 916 may be disposed to overlap or surround the respective additional sub-pixels SPXA. Therefore, the additional light-emitting elements 140A disposed in the respective additional sub-pixels SPXA may be firmly coupled with the lower substrate 110, and the third area A3 may be more flexibly stretched.

Figure 12A:
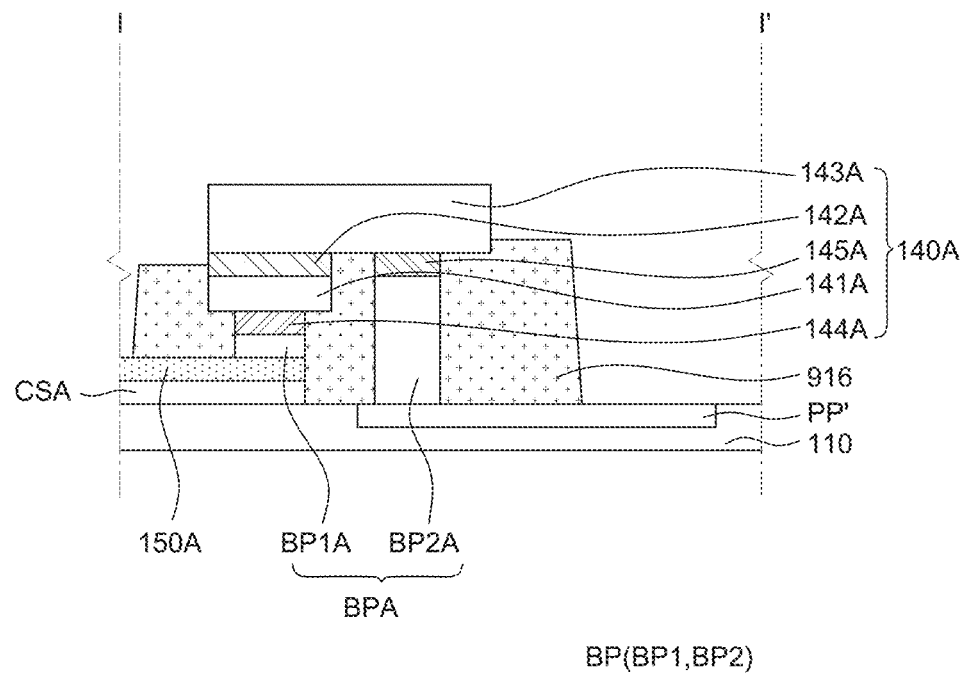
FIGS. 12A and 12B are schematic cross-sectional views of an additional sub-pixel of a stretchable display device according to yet another example embodiment of the present disclosure.
Figure 12B:
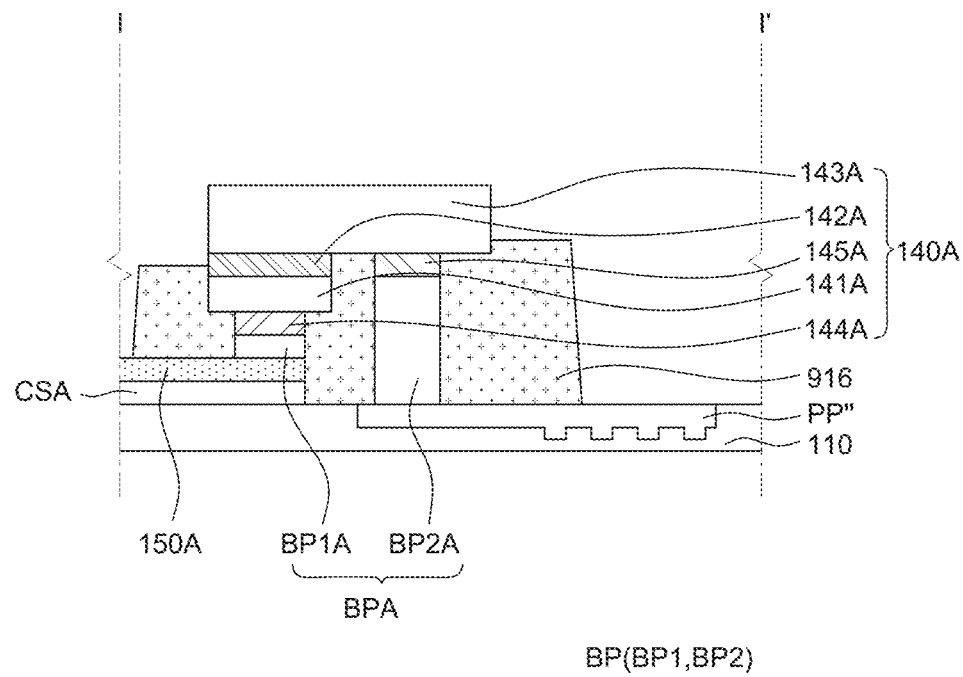

FIGS. 12A and 12B are schematic cross-sectional views of an additional sub-pixel of a stretchable display device according to still another example embodiment of the present disclosure, such as cross-sectional views of the additional sub-pixel SPXA obtained by cutting the area I-I' of the stretchable display device 800 shown in FIG. 8. The stretchable display device 800 of FIGS. 12 and 12B may be substantially identical to the stretchable display device 100 shown in FIGS. 1 to 3, except that the stretchable display device 800 of FIGS. 12 and 12B further includes a reinforcing layer 916 and piezoelectric patterns PP' and PP" having different shapes. Therefore, redundant description will be omitted.

With reference to FIG. 12A, the piezoelectric pattern PP' may include a portion that overlaps with the reinforcing layer 916 and a portion that does not overlap with the reinforcing layer 916. That is to say, the piezoelectric pattern PP' may be formed in an area that overlaps with the reinforcing layer 916 and receives less stress by an external pressure as the lower substrate 110 is less stretched, and also in an area that does not overlap with the reinforcing layer 916 and receives more stress by an external pressure as the lower substrate 110 is more stretched. Accordingly, even when the third area A3 is expanded, the piezoelectric pattern PP' may reliably maintain the electrical coupling with the additional light-emitting elements 140A and may evenly receive stress by an external pressure, so that the time taken to converge to a specific voltage may be reduced.

With reference to FIG. 12B, the piezoelectric pattern PP" may include a plurality of uneven parts. The contact surface between the piezoelectric pattern PP" shown in FIG. 12B and the lower substrate 110 may be larger than the contact surface between the piezoelectric pattern PP' shown in FIG. 12A and the lower substrate 110. In addition, as the contact surface between the piezoelectric pattern PP" and the lower substrate 110 increases, the piezoelectric pattern PP" receives more stress due to an external pressure. In an example, the plurality of uneven parts included in the piezoelectric pattern PP" may be mainly distributed in the area that does not overlap with the reinforcing layer 916. Accordingly, the piezoelectric pattern PP" may be more affected by stress when the lower substrate 110 is stretched.

The uneven part may include a plurality of protrusions from the flat body of the piezoelectric pattern PP". Some portions of the uneven part may overlap with the reinforcing layer 916, while some other portions may not overlap with the reinforcing layer 916. It is, however, to be understood that the present disclosure is not limited thereto. The uneven part may be formed only in the area that does not overlap with the reinforcing layer 916.

FIG. 12B shows that the piezoelectric pattern PP" has a shape having a plurality of uneven parts protruding from the lower surface of the piezoelectric pattern PP", but the present disclosure is not limited thereto. For example, the piezoelectric pattern PP" may have a polygonal cross section when viewed from the top, or a shape protruding in a plane direction. In addition, the shape protruding in the plane direction may further include a plurality of uneven parts protruding in the vertical direction. As such, the piezoelectric pattern PP" having an increased contact area with the lower substrate 110 may receive stresses by an external pressure more efficiently, and thus, time to converge to a specific voltage may be shortened. In addition, the piezoelectric pattern PP" may have a shape including a portion extended in a direction perpendicular to the direction in which the third area A3 is stretched to receive more stress by an external pressure.

The example embodiments of the present disclosure can also be described as follows.

According to an aspect of the present disclosure, there is provided a stretchable display device. The stretchable display device includes a lower substrate comprising a plurality of first areas on which a plurality of pixels is defined and spaced apart from one another, a plurality of second areas in which a plurality of connection lines connecting between adjacent ones of the first areas is disposed, and a plurality of third areas other than the first areas and the second areas, a plurality of additional sub-pixels disposed in the third areas, respectively, and a plurality of piezoelectric patterns electrically connected to the additional sub-pixels, respectively.

The stretchable display device may further include a plurality of island substrates disposed in the first areas, respectively, wherein the sub-pixels are defined on the island substrate, a plurality of light-emitting elements disposed in the sub-pixels, respectively, on the island substrates, and a plurality of additional light-emitting elements disposed in the additional sub-pixels, respectively. Each of the light-emitting elements may include an emissive layer, a first electrode electrically connected to the emissive layer, and a second electrode electrically connected to the emissive layer and spaced apart from the first electrode. Each of the additional light-emitting elements may include an additional emissive layer, a first additional electrode electrically connected to the additional emissive layer, and a second additional electrode electrically connected to the additional emissive layer and spaced apart from the first additional electrode. Each of the piezoelectric patterns may be electrically connected to the second additional electrode of the additional light-emitting elements.

A voltage applied to a first electrode of a first light-emitting element among the light-emitting elements may be equal to a voltage applied to a first additional electrode of a first additional light-emitting element among the additional light-emitting elements.

The stretchable display may further include a first transistor disposed on one of the island substrates where the first light-emitting element is disposed, wherein the first transistor is configured to apply a same voltage to the first electrode of the first light-emitting element and to the first additional electrode of the first additional light-emitting element.

The plurality of light-emitting elements and the plurality of additional light-emitting elements may be configured to be driven independently.

The stretchable display device may further include a first transistor connected to a first electrode of a first light-emitting element among the light-emitting elements and disposed on one of the island substrates where the first light-emitting element is disposed, and a second transistor connected to a first additional electrode of a first additional light-emitting element among the light-emitting elements and disposed on the same island substrate as the first transistor.

The stretchable display device may further include a plurality of additional connection lines electrically connected to the first additional electrodes of the plurality of additional light-emitting elements, respectively, and a plurality of additional connection substrates disposed between the additional connection lines and the lower substrate and formed integrally with the island substrates.

The stretchable display device may further include a plurality of additional connection patterns disposed adjacent to the plurality of additional connection substrates, wherein the additional connection patterns electrically connect the piezoelectric patterns with the second additional electrodes of the additional light-emitting elements, respectively.

The stretchable display device may further include an additional insulating layer disposed between the additional connection lines and the additional connection substrates.

The additional sub-pixels may be orientated obliquely with respect to a direction in which the connection lines are extended.

The lower substrate may further include grooves formed in the third areas. The piezoelectric patterns may be disposed in the grooves, respectively.

According to another aspect of the present disclosure, there is provided a stretchable display device. The stretchable display device includes a plurality of rigid boards having a plurality of light-emitting elements disposed thereon and spaced apart from one another, a plurality of connection lines electrically connecting between pads disposed on adjacent ones of the rigid boards, a lower substrate disposed under the rigid boards and the connection lines, a plurality of additional light-emitting elements disposed on the lower substrate such that they are spaced apart from the rigid boards and the connection lines, and a plurality of piezoelectric patterns electrically connected to the additional light-emitting elements and generating a first voltage when the lower substrate is stretched, wherein the additional light-emitting elements emit light by the first voltage from the piezoelectric patterns when the lower substrate is stretched in order to suppress a lattice pattern from being perceived by a viewer.

The first voltage may be applied to the additional light-emitting elements from the piezoelectric patterns when the lower substrate is stretched and accordingly an external force is applied to the piezoelectric patterns, and wherein the piezoelectric patterns become floating when the external force applied to the piezoelectric pattern is removed.

Each of the plurality of additional light-emitting elements may include an additional emissive layer, a first additional electrode electrically connected to the additional emissive layer, and a second additional electrode electrically connected to the additional emissive layer and spaced apart from the first additional electrode, wherein the second additional electrode is electrically connected to the piezoelectric patterns, respectively.

The stretchable display device may further include a plurality of first transistors disposed on the rigid boards and electrically connected to the light-emitting elements, respectively, and a plurality of additional connection lines electrically connecting the first transistors with first additional electrodes of the additional light-emitting elements, respectively.

The stretchable display device may further include a plurality of first transistors disposed on the rigid boards and electrically connected to the light-emitting elements, respectively, a plurality of second transistors disposed on the rigid boards, and a plurality of additional connection lines electrically connecting the second transistors with first additional electrodes of the additional light-emitting elements, respectively.

The additional connection lines may have an inclination with respect to the connection lines.

A lower surface of each of the piezoelectric patterns may be disposed between a lower surface of the lower substrate and an upper surface of the lower substrate.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

It will be apparent to those skilled in the art that various modifications and variations can be made in the display apparatus of the present disclosure without departing from the technical idea or scope of the disclosure. Thus, it is intended that the present disclosure covers the modifications and variations of this disclosure provided they come within the scope of the appended claims and their equivalents.

What is claimed is:

1. A stretchable display device, comprising:
   a lower substrate including:
   a plurality of first areas in which a plurality of sub-pixels is included,
   a plurality of second areas in which a plurality of connection lines is included, the connection lines electrically connecting adjacent ones of the first areas, and
   a plurality of third areas other than the first areas and the second areas;
   a plurality of additional sub-pixels in the respective third areas;
   a plurality of light-emitting elements in the respective sub-pixels;
   a plurality of additional light-emitting elements in the respective additional sub-pixels; and
   a plurality of piezoelectric patterns disposed in the respective additional sub-pixels, and electrically connected to the respective additional light-emitting elements,
   wherein the adjacent ones of the first areas are spaced apart from one another, and
   wherein the plurality of piezoelectric patterns is spaced apart from the plurality of connection lines.

2. The stretchable display device of claim 1, further comprising:
   a plurality of island substrates in the respective first areas, wherein the sub-pixels are on the respective island substrates,
   wherein the plurality of light-emitting elements is disposed on the island substrates,
   wherein each of the light-emitting elements includes:
   an emissive layer,
   a first electrode electrically connected to the emissive layer, and a second electrode electrically connected to the emissive layer and spaced apart from the first electrode, wherein each of the additional light-emitting elements includes:

an additional emissive layer, a first additional electrode electrically connected to the additional emissive layer, and a second additional electrode electrically connected to the additional emissive layer and spaced apart from the first additional electrode, and wherein each of the piezoelectric patterns is electrically connected to the respective second additional electrode of the additional light-emitting elements.

3. The stretchable display device of claim 2, wherein a voltage applied to a first electrode of a first light-emitting element among the light-emitting elements is equal to a voltage applied to a first additional electrode of a first additional light-emitting element among the additional light-emitting elements.

4. The stretchable display device of claim 3, further comprising:

a first transistor on one of the island substrates where the first light-emitting element is disposed, wherein the first transistor is configured to apply a same voltage to the first electrode of the first light-emitting element and to the first additional electrode of the first additional light-emitting element.

5. The stretchable display device of claim 2, wherein the plurality of light-emitting elements and the plurality of additional light-emitting elements are configured to be controlled independently.

6. The stretchable display device of claim 5, further comprising:

a first transistor connected to a first electrode of a first light-emitting element among the light-emitting elements and on one of the island substrates where the first light-emitting element is disposed; and a second transistor connected to a first additional electrode of a first additional light-emitting element among the light-emitting elements and on the same island substrate as the first transistor.

7. The stretchable display device of claim 2, further comprising:

a plurality of additional connection lines electrically connected to respective first additional electrodes of the plurality of additional light-emitting elements; and a plurality of additional connection substrates between the additional connection lines and the lower substrate.

8. The stretchable display device of claim 7, further comprising:

a plurality of additional connection patterns on the plurality of additional connection substrates, wherein the additional connection patterns electrically connect the piezoelectric patterns with respective second additional electrodes of the additional light-emitting elements.

9. The stretchable display device of claim 7, further comprising:

an additional insulating layer between the additional connection lines and the additional connection substrates.

10. The stretchable display device of claim 2, further comprising:

a reinforcing layer disposed in the plurality of additional sub-pixels, wherein the reinforcing layer overlaps with the additional light-emitting elements.

11. The stretchable display device of claim 2, wherein the plurality of piezoelectric patterns includes a plurality of protrusions in contact with the lower substrate.

12. The stretchable display device of claim 1, wherein the additional sub-pixels are orientated obliquely with respect to a direction in which the connection lines are extended.

13. The stretchable display device of claim 1, wherein the lower substrate further comprises grooves in the third areas, and wherein the piezoelectric patterns are in the respective grooves.

14. A stretchable display device, comprising:

a plurality of rigid boards including a plurality of light-emitting elements disposed thereon and spaced apart from one another;

a plurality of connection lines electrically connecting pads disposed on adjacent ones of the rigid boards;

a lower substrate under the rigid boards and the connection lines;

a plurality of additional light-emitting elements on the lower substrate and spaced apart from the rigid boards and the connection lines;

a plurality of first transistors on the rigid boards and electrically connected to the respective additional light-emitting elements; and a plurality of piezoelectric patterns electrically connected to the additional light-emitting elements and configured to convert mechanical energy into electrical energy, wherein each of the plurality of additional light-emitting elements includes an additional emissive layer, a first additional semiconductor layer electrically connected to the additional emissive layer, a first additional electrode electrically connected to first additional semiconductor layer and the respective first transistors, a second additional semiconductor layer electrically connected to the additional emissive layer, and a second additional electrode electrically connected to the second additional semiconductor layer and the respective piezoelectric patterns, wherein when the stretchable display device is stretched by an external force, mechanical energy is applied to the respective piezoelectric patterns from the external force, and a first voltage that is electrical energy is generated from the respective piezoelectric patterns and provided to the second additional electrode of the additional light-emitting elements, and wherein the additional light-emitting elements emit light according to a voltage from the first transistor and the first voltage from the piezoelectric patterns when the stretchable display device is turned on and stretched, and thereby suppress a lattice pattern from being perceived by a viewer.

15. The stretchable display device of claim 14, wherein the piezoelectric patterns become electrically floating when the external force applied to the piezoelectric pattern is removed.

16. The stretchable display device of claim 14, wherein the second additional semiconductor layer is spaced apart from the first additional semiconductor layer.

17. The stretchable display device of claim 16, wherein the plurality of first transistors is electrically connected to the respective light-emitting elements; and a plurality of additional connection lines electrically connecting the first transistors with respective first additional semiconductor layers of the additional light-emitting elements.

18. The stretchable display device of claim 17, wherein the additional connection lines have an inclination with respect to the connection lines.

19. The stretchable display device of claim 14, wherein a lower surface of each of the piezoelectric patterns is between a lower surface of the lower substrate and an upper surface of the lower substrate.

\* \* \* \* \*